US009900529B2

United States Patent
Ishiga et al.

(10) Patent No.: US 9,900,529 B2
(45) Date of Patent: Feb. 20, 2018

(54) IMAGE PROCESSING APPARATUS, IMAGE-CAPTURING APPARATUS AND IMAGE PROCESSING APPARATUS CONTROL PROGRAM USING PARALLAX IMAGE DATA HAVING ASYMMETRIC DIRECTIONAL PROPERTIES

(71) Applicant: NIKON CORPORATION, Chiyoda-ku, Tokyo (JP)

(72) Inventors: Kenichi Ishiga, Yokohama (JP); Kiyoshige Shibazaki, Higashimurayama (JP)

(73) Assignee: NIKON CORPORATION, Tokyo (JP)

( * ) Notice: Subject to any disclaimer, the term of this patent is extended or adjusted under 35 U.S.C. 154(b) by 207 days.

(21) Appl. No.: 14/618,289

(22) Filed: Feb. 10, 2015

(65) Prior Publication Data
US 2015/0156430 A1   Jun. 4, 2015

Related U.S. Application Data

(63) Continuation of application No. PCT/JP2013/004788, filed on Aug. 8, 2013.

(30) Foreign Application Priority Data

Aug. 10, 2012 (JP) ................................. 2012-179044

(51) Int. Cl.
*H04N 5/225* (2006.01)
*H04N 5/357* (2011.01)
(Continued)

(52) U.S. Cl.
CPC ............ *H04N 5/357* (2013.01); *G06T 5/002* (2013.01); *H04N 5/23212* (2013.01); *H04N 5/3696* (2013.01); *H04N 13/0225* (2013.01)

(58) Field of Classification Search
CPC .................................................... H04N 5/3696
See application file for complete search history.

(56) References Cited

U.S. PATENT DOCUMENTS

| 7,362,897 B2 | 4/2008 | Ishiga |
| 2007/0013794 A1* | 1/2007 | Tsuruoka ............... H04N 9/045 |
| | | 348/241 |

(Continued)

FOREIGN PATENT DOCUMENTS

| JP | 2002-152761 A | 5/2002 |
| JP | 2003-007994 A | 1/2003 |

(Continued)

OTHER PUBLICATIONS

Chinese Office Action dated Feb. 14, 2016 as received in corresponding Chinese Application No. 201380041639.8 and the English translation of same.

(Continued)

*Primary Examiner* — Twyler Haskins
*Assistant Examiner* — Dwight C Tejano
(74) *Attorney, Agent, or Firm* — Foley & Lardner LLP

(57) ABSTRACT

An image processing apparatus, comprising: a receiving unit receiving a first image and image-capturing information associated with the first image; a determining unit determining, based on the image-capturing information, whether or not the first image is an image of a subject image in a view point direction corresponding to the aperture mask, using an output signal of an image sensor that includes a pixel array including first parallax pixels having the aperture mask with asymmetric directional properties in the long axis and short axis with respect to incident light flux of a single optical system and positioned to permit a portion of the light flux to pass; and an outputting unit outputting a corrected first image by carrying out a correction process having different frequency properties between the long axis direction and the (Continued)

short axis direction on the subject image in an unfocused region of the first image.

23 Claims, 11 Drawing Sheets

(51) Int. Cl.
    *H04N 5/232*     (2006.01)
    *H04N 13/02*     (2006.01)
    *G06T 5/00*     (2006.01)
    *H04N 5/369*     (2011.01)

(56) References Cited

U.S. PATENT DOCUMENTS

| | | | |
|---|---|---|---|
| 2008/0199098 A1 | 8/2008 | Kasai et al. | |
| 2009/0256952 A1* | 10/2009 | Kusaka | G02B 27/16 |
| | | | 348/349 |
| 2011/0096212 A1* | 4/2011 | Oikawa | G03B 13/36 |
| | | | 348/273 |
| 2011/0228145 A1* | 9/2011 | Kimura | G02B 7/102 |
| | | | 348/247 |
| 2012/0140100 A1* | 6/2012 | Shibazaki | H01L 27/14621 |
| | | | 348/281 |
| 2013/0002936 A1* | 1/2013 | Hirama | H04N 5/23212 |
| | | | 348/349 |
| 2013/0162780 A1 | 6/2013 | Kurahashi | |
| 2015/0062308 A1 | 3/2015 | Ishiga | |

FOREIGN PATENT DOCUMENTS

| | | |
|---|---|---|
| JP | 2004-056516 A | 2/2004 |
| JP | 2006-234626 A | 10/2008 |
| JP | 4748278 B2 | 8/2011 |
| WO | WO 2012/039346 A1 | 3/2012 |
| WO | WO 2012/073491 A1 | 6/2012 |

OTHER PUBLICATIONS

Translation of Written Opinion of the International Searching Authority on PCT/JP2013/004788, dated Oct. 29, 2013 and International Search Report mailed on same date.

* cited by examiner

VERTICAL DIRECTION BLURRING IN HORIZONTAL LINE

HORIZONTAL DIRECTION BLURRING IN VERTICAL LINE

PARALLAX Lt PIXEL

PARALLAX Rt PIXEL

IMAGE PROCESSING APPARATUS, IMAGE-CAPTURING APPARATUS AND IMAGE PROCESSING APPARATUS CONTROL PROGRAM USING PARALLAX IMAGE DATA HAVING ASYMMETRIC DIRECTIONAL PROPERTIES

The Contents of the following Japanese patent applications are incorporated herein by reference:
No. 2012-179044 filed in JP on Aug. 10, 2012, and PCT/JP2013/004788 filed on Aug. 8, 2013.

TECHNICAL FIELD

The present invention relates to an image processing apparatus, an image-capturing apparatus, and an image processing apparatus control program.

BACKGROUND ART

An image-capturing apparatus that generates with a single image-capturing left and right parallax images each having a parallax using a single image-capturing optical system is known.

Patent Document 1: Japanese Patent Application Publication No. 2003-7994

SUMMARY OF INVENTION

In Patent Document 1, an image-capturing system is disclosed in which left aperture parallax pixels and right aperture parallax pixels fill a single plate type Bayer array color solid-state image sensor, so that it is possible to form stereoscopic images with a single image-capturing using a single camera. However, Patent Document 1 does not disclose the properties of the images that can be obtained by image-capturing. Therefore, it is not clear what the blurring properties of the image data actually captured are or whether or not this is naturally produced blurring. In fact, each of the left and right parallax images produced by this type of image-capturing apparatus has asymmetrical blurring in the horizontal direction and the vertical direction, so there is the problem that it is not possible to obtain natural blurring.

An image processing apparatus according to a first aspect of the present invention includes: a receiving unit receiving a first image and image-capturing information associated with the first image; a determining unit determining, based on the image-capturing information, whether or not the first image is an image of a subject image in a view point direction corresponding to the aperture mask, using an output signal of an image sensor that includes a pixel array including first parallax pixels having the aperture mask with asymmetric directional properties in the long axis and short axis with respect to incident light flux of a single optical system and positioned to permit a portion of the light flux to pass; and an outputting unit outputting a corrected first image by carrying out a correction process having different frequency properties between the long axis direction and the short axis direction on the subject image in an unfocused region of the first image.

An image processing apparatus according to a second aspect of the present invention includes: a receiving unit receiving a first image and image-capturing information associated with the first image; a determining unit determining, based on the image-capturing information, using an image sensor that includes a pixel array including at least first parallax pixels having a first aperture mask and second parallax pixels having a second aperture mask with asymmetric directional properties in the long axis and short axis with respect to incident light flux of a single optical system and positioned to permit mutually different portions of the light flux to pass, and non-parallax pixels having a third aperture mask positioned to permit all the incident light flux to pass, whether or not the first image is an image of a subject image in a view point direction corresponding to the first aperture mask, a subject image in a view point direction corresponding to the second aperture mask, and a subject image in a view point direction corresponding to the third aperture mask, captured simultaneously in different pixels; a generating unit generating a standard image in a view point direction corresponding to the third aperture mask, using signals of the non-parallax pixels, the first parallax pixels, and the second parallax pixels of the captured image; and an outputting unit outputting a corrected standard image by carrying out a correction process having different frequency properties between the long axis direction and the short axis direction on the subject image in the unfocused region of the standard image.

An image processing apparatus according to a third aspect of the present invention includes: an image acquisition unit acquiring input parallax image data and image-capturing information associated with the input parallax image data, the image-capturing information indicating that the input parallax image data was generated from the output of pixels having a light receiving region with different lengths in the two axial directions; and an image processor carrying out filtering on the image based on the input parallax image data associated with the image-capturing information, so that the amounts of change in the spatial frequency in a first axis direction and a second axis direction corresponding to the two axis directions are different from each other.

An image-capturing apparatus according to a fourth aspect of the present invention includes an image sensor that outputs parallax image data, and any one of the above image processing apparatus.

Non-transitory computer readable medium having an image processing apparatus control program executed by a computer according to a fifth aspect of the present invention, the image processing program causing a computer to perform procedures of: an image acquisition step of acquiring parallax image data associated with image-capturing information indicating that it was generated from the output of pixels having a light receiving region with different lengths in two axial directions; and an image processing step of carrying out filtering on the image based on the parallax image data associated with the image-capturing information, so that the amounts of change in the spatial frequency in a first axis direction and a second axis direction corresponding to the two axis directions are different from each other.

The summary of the invention is not intended to define the scope of the invention and does not necessarily constitute a list of features that are necessary or sufficient to define the present invention. Sub-combinations of the listed features should also be regarded as entire embodiments of the invention within the scope of this disclosure.

DESCRIPTION OF EMBODIMENTS

The present invention will be described below using embodiments of the invention, but the following embodiments are not intended to limit the scope of the invention, which is defined by the claims. The characteristics described with respect to the embodiments are not necessarily essential to the invention.

Figure 1:
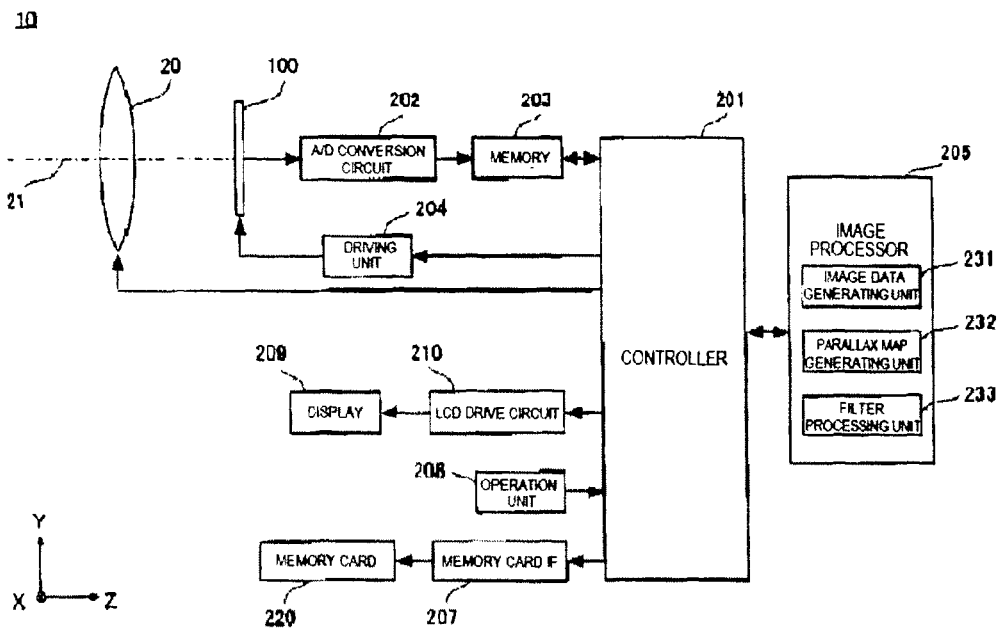
FIG. 1 is an explanatory view of the configuration of a digital camera 10.

FIG. 1 shows a configuration of a digital camera 10 according to an embodiment of the present invention, the digital camera 10 being one aspect of an image-capturing apparatus and being configured so that it is capable of generating in one scene a left view point image and a right view point image with a single image-capturing. Each image having different viewpoints is referred to as a parallax image.

The digital camera 10 includes an image-capturing lens 20 as an image-capturing optical system, and guides the subject light flux that is incident along an optical axis 21 thereof to an image sensor 100. The image-capturing lens 20 may be an exchangeable lens that can be attached to the digital camera 10. The digital camera 10 includes the image sensor 100, a controller 201, an A/D conversion circuit 202, a memory 203, a driving unit 204, an image processor 205, a memory card IF 207, an operation unit 208, a display 209, and an LCD drive circuit 210.

As shown in FIG. 1, a direction parallel to the optical axis 21 toward the image sensor 100 is defined as the Z-axis positive direction, a direction orthogonal to the plane of the Z-axis and moving upward from the plane of the drawing is defined as the X-axis positive direction, and a direction upward within the plane of the drawing is defined as the Y-axis positive direction. In relation to composition when capturing images, the X-axis is the horizontal direction and the Y-axis is the vertical direction. In several of the following drawings, the coordinate axes of FIG. 1 are used as a reference to display the orientation of the drawings on coordinate axes.

The image-capturing lens 20 is configured by a plurality of optical lens groups, and focuses the subject light flux from a scene near the focal plane thereof. In FIG. 1, for ease of explanation, the image-capturing lens 20 is represented by a single virtual lens arranged near the pupil. The image sensor 100 is arranged near the focal plane of the image-capturing lens 20. The image sensor 100 is an image sensor, such as a CCD or CMOS sensor, in which a plurality of photoelectric converting elements is arranged two-dimensionally. Although explained in detail later, the image sensor 100 includes pixels with light receiving regions that have different lengths in the two axial directions. Here, light receiving region refers to the region of a photoelectric converting element described below that actually receives light. By forming the photoelectric converting element so that the vertical to horizontal ratio of the photoelectric converting element itself is different, it is possible to form pixels having light receiving regions in which the length is different in the two axial directions. Also, by restricting the light that is incident on the photoelectric converting element by covering a portion of the photoelectric converting element with an aperture mask that is described later, it is possible to form pixels having light receiving regions in which the length is different in the two axial directions. The timing of the image sensor 100 is controlled by the driving unit 204, and the image sensor 100 converts a subject image focused on a light receiving surface into an image signal and outputs the image signal to the A/D conversion circuit 202. The image signal to be output to the A/D conversion circuit 202 includes left view point and right view point image signals.

The A/D conversion circuit 202 converts the image signal output from the image sensor 100 into a digital image signal and outputs it to the memory 203. The image processor 205 performs various types of image processing using the memory 203 as a work space, to generate image data. In particular, the image processor 205 includes an image data generating unit 231, a disparity map generating unit 232, and a filter processing unit 233.

The image data generating unit 231 generates, for example, left parallax image data corresponding to a left view point and right parallax image data corresponding to a right view point. In addition, the image data generating unit 231 associates the image information indicating that the left parallax image data and the right parallax image data were generated from the output of the pixels as described above, with the left parallax image data and the right parallax image data. The image data generating unit 231 associates the image information described above with the left parallax image data and the right parallax image data as, for example, Exif information.

The disparity map generating unit 232 generates evaluation data for the left view point and right view point disparity. Although described in detail later, the evaluation data can be taken to be the disparity map data indicating the positional information regarding the depth of the subject relative to the focus region.

The filter processing unit 233 carries out filtering on, for example, the left parallax image data and the right parallax image data associated with the image data described above in accordance with the disparity map described above. The filtering is described in detail later.

The image processor 205 also undertakes general image processing such as adjusting image data in accordance with selected image formats, and the like. The various types of image data generated by the image processor 205 are converted into display signals by the LCD drive circuit 210, and displayed on the display 209. The evaluation data may also be displayed on the display 209. Also, the various types of image data generated and the evaluation data are recorded on a memory card 220 installed in the memory card IF 207.

A series of image-capturing sequences is begun as a result of the operation unit 208 receiving user's manipulation to output a manipulation signal to the controller 201. Execution of the various operations associated with the image-capturing sequence, such as AF, AE, and the like, is controlled by the controller 201. For example, the controller 201 analyzes the evaluation data, and executes focusing control to move a focusing lens that constitutes a portion of the image-capturing lens 20.

Figure 2:
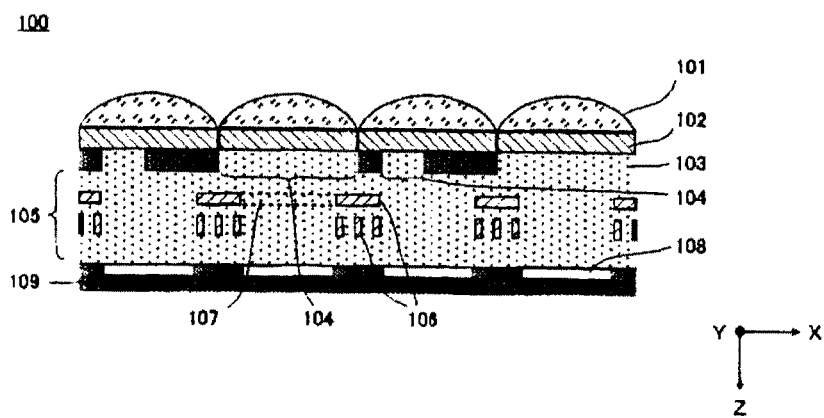
FIG. 2 is an explanatory view of the configuration of a cross-section of an image sensor 100.

Next, the configuration of the image sensor 100 is described in detail. FIG. 2 is a schematic view illustrating a cross-section of the image sensor 100 according to an embodiment of the present invention.

The image sensor 100 is formed by arranging microlenses 101, color filters 102, aperture masks 103, a wiring layer 105, and photoelectric converting elements 108 in the stated order from the subject side. The photoelectric converting elements 108 are each formed by a photodiode that converts incident light into an electrical signal. A plurality of photoelectric converting elements 108 is arranged two-dimensionally on the surface of a substrate 109.

The image signal resulting from the conversion by the photoelectric conversion elements 108 and the control signals for controlling the photoelectric conversion elements 108, for example, are transmitted and received by wiring 106 provided in the wiring layer 105. Also, the aperture masks 103, provided corresponding one-to-one with each of the photoelectric converting elements 108, include an aperture portion 104 arranged repetitively in a two-dimensional array and are provided in contact with the wiring layer. As described later, the aperture portions 104 are shifted in accordance with a corresponding one of the photoelectric converter elements 108 and are strictly positioned at locations relative to the corresponding photoelectric conversion element 108. The specifics are described further below, but the aperture masks 103 having aperture portions 104 function to create parallaxes in the subject light flux received by the photoelectric conversion elements 108.

On the other hand, there is no aperture mask 103 positioned above the photoelectric converting elements 108 that do not cause a parallax. In other words, it can also be said that aperture masks 103 are provided including aperture portions 104 that pass all effective light, i.e., that do not limit the subject light flux incident to the corresponding photoelectric converting elements 108. Although no parallax is caused, the aperture 107 formed by the wiring 106 substantially defines the incident subject light flux, and therefore the wiring 106 can be thought of as an aperture mask that passes all the incident light flux and does not cause a parallax. Each aperture mask 103 may be arranged independently in correspondence with a photoelectric converting element 108, or the aperture masks 103 may be formed en bloc for a plurality of photoelectric converting elements 108 using the same manufacturing process as used for the color filters 102.

The color filters 102 are provided on the aperture masks 103. The color filters 102 correspond one-to-one with the photoelectric converting elements 108, and each color filter 102 is colorized to pass a specified wavelength band to the corresponding photoelectric converting element 108. In order to output a color image, it is only necessary to arrange two different types of color filters, but a higher quality color image can be obtained if three or more types of color filters are provided. For example, red filters (R filters) that pass a red wavelength band, green filters (G filters) that pass a green wavelength band, and blue filters (B filters) that pass a blue wavelength band may be arranged in a grid. The color filters are not limited to the combination of primary colors RGB, but may be the combination of complementary color filters YCM. Specific arrays are described later.

The microlenses 101 are provided on the color filters 102. Each microlens 101 is a converging lens that guides a majority of the subject light flux incident thereto to the corresponding photoelectric converting element 108. The microlenses 101 correspond one-to-one with the photoelectric converting elements 108. Each microlens 101 preferably has the optical axis thereof shifted to guide more subject light flux to the corresponding photoelectric converting element 108, with consideration to the relative positions of the center of the pupil of the image-capturing lens 20 and the corresponding photoelectric converting element 108. Furthermore, in addition to adjusting the positioning of the aperture portions 104 of the aperture masks 103, the positioning of the microlenses 101 may be adjusted such that more of the specified subject light flux that is described layer is incident.

In this way, the single unit of an aperture mask 103, a color filter 102, and a microlens 101 provided one-to-one with each photoelectric converting element 108 is referred to as a pixel. More specifically, a pixel including an aperture mask 103 that causes a parallax is referred to as a parallax pixel, and a pixel including an aperture mask 103 that does not cause a parallax is referred to as a non-parallax pixel. A left view point parallax pixel is sometimes referred to as a parallax Lt pixel, a right view point parallax pixel is sometimes referred to as a parallax Rt pixel, and a non-parallax pixel is sometimes referred to as an N pixel. Also, a left view point parallax image is sometimes referred to as a parallax Lt image, a right view point parallax image is sometimes referred to as a parallax Rt image, and a non-parallax image is sometimes referred to as an N image. For example, if the effective pixel region of the image sensor 100 is approximately 24 mm by 16 mm, there may be approximately 12 million pixels.

If the image sensor has good collection efficiency and photoelectric conversion efficiency, the microlenses 101 need not be provided. If a back-illuminated image sensor is used, the wiring layer 105 is provided on the opposite side of the photoelectric converting elements 108. If the aperture portions 104 of the aperture masks 103 have a color component, the color filters 102 and the aperture masks 103 can be formed integrally. If only a black and white image signal is to be output, the color filters 102 are not provided.

Also, in this embodiment, the aperture mask 103 and the wiring 106 are provided separately, but the wiring 106 may undertake the function of the aperture mask 103 in the parallax pixel. In other words, the prescribed aperture shape is formed by the wiring 106, and the incident light flux is restricted by the aperture shape and only a specific partial luminous flux is guided to the photoelectric converting element 108. In this case, preferably, the wiring 106 that forms the aperture shape is on the side of the wiring layer 105 closest to the photoelectric converting element 108.

Also, the aperture mask 103 may be formed by a transmission prevention film provided superimposed on the photoelectric converting element 108. In this case, the aperture mask 103 is a transmission prevention film formed by, for example, stacking a SiN film and a $SiO_2$ film in that order, and removing the region corresponding to the aperture portion 104 by etching.

<Parallax Pixels and Blurring Properties>

Figure 3A:
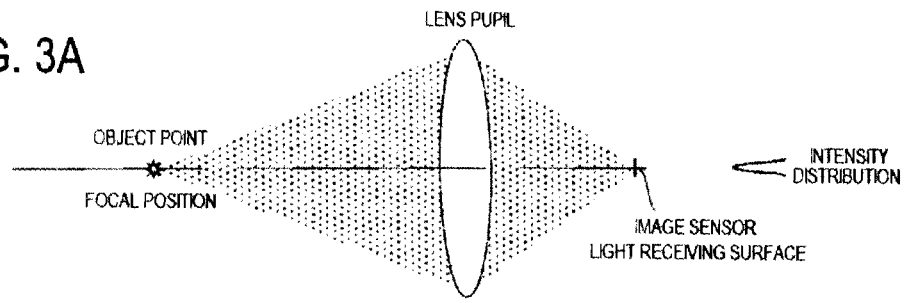
FIGS. 3A, 3B, 3C and 3D are explanatory views of the concept of defocus in a non-parallax pixel.

Next, the concept of defocus when a parallax Lt pixel and a parallax Rt pixel receive light is described. First, the concept of defocus in a non-parallax pixel is simply described. FIGS. 3A to 3D are explanatory views of the concept of defocus in a non-parallax pixel. As shown in FIG. 3A, if an object point which is a subject is at the focal position, the subject light flux that arrives at the image sensor light receiving surface through the lens and pupil exhibits a steep light intensity distribution with the pixel at the corresponding image point as center. In other words, if a non-parallax pixel that receives all the effective light that passes through the lens pupil is arranged near the image point, the output value of the pixel corresponding to the image point will be largest, and the output values of the pixels arranged at the periphery thereof will be greatly reduced.

Figure 3B:
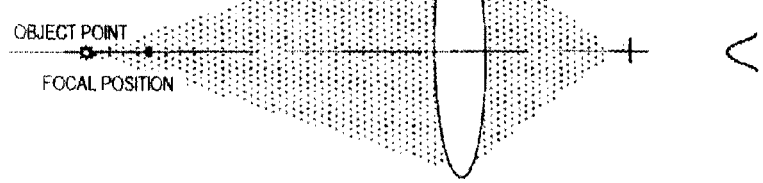

On the other hand, as shown in FIG. 3B, if the object point is shifted from the focal point position in a direction away from the image sensor light receiving surface, the subject light flux exhibits a gentler light intensity distribution on the image sensor light receiving surface compared with the case where the object point is at the focal point position. In other words, a distribution is shown in which the output value of the pixel at the corresponding image point is reduced, and the output values of the peripheral pixels are increased.

Figure 3C:
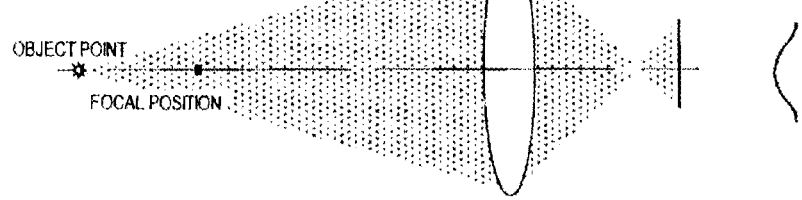

As shown in FIG. 3C, if the object point is shifted further from the focal point position, the subject light flux exhibits a further gentler light intensity distribution on the image sensor light receiving surface. In other words, a distribution is exhibited in which the output value of the pixel at the corresponding image point is further reduced, and the output values of the peripheral pixels are increased.

Figure 3D:
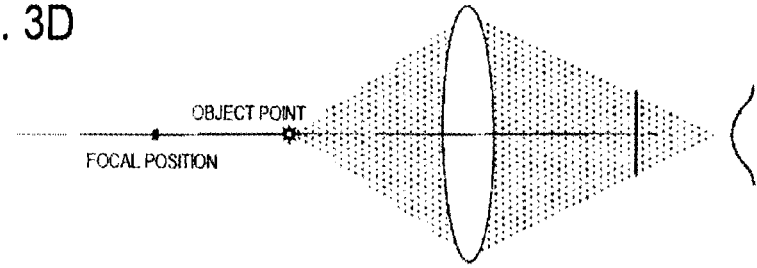

As shown in FIG. 3D, if the object point is shifted from the focus position in a direction approaching the image sensor light receiving surface, a light intensity distribution is exhibited that is the same as that in the case where the object point is shifted in the direction away from the image sensor light receiving surface.

FIGS. 4A to 4D are explanatory views of the concept of defocus in a parallax pixel. The parallax Lt pixel and the parallax Rt pixel receive subject light flux arriving from one of two parallax virtual pupils set symmetrically on the optical axis as a lens pupil partial region. In this specification, the system of capturing a parallax image by receiving subject light flux arriving from different virtual pupils in a single lens pupil is referred to as the single pupil divided image-capturing system.

Figure 4A:
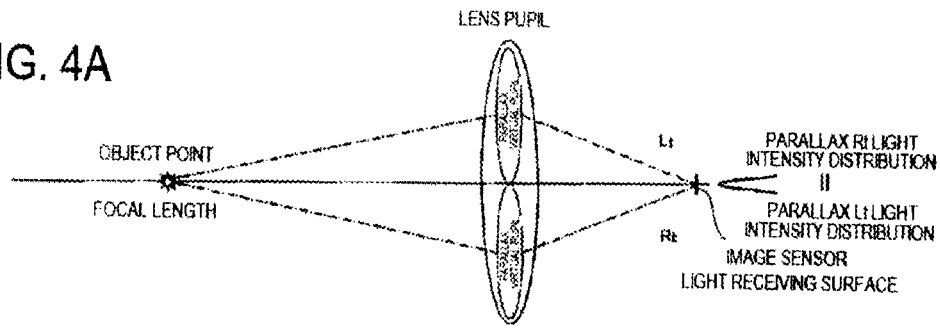
FIGS. 4A, 4B, 4C and 4D are explanatory views of the concept of defocus in a parallax pixel.

As shown in FIG. 4A, if an object point which is a subject is at the focal position, the subject light flux that has passed through either of the parallax virtual pupils exhibits a steep light intensity distribution with the pixel at the corresponding image point as center. If the parallax Lt pixel is arranged near the image point, the output value corresponding to the image point will be largest, and the output values of the surrounding pixels will be greatly reduced. Also, if the parallax Rt pixel is arranged near the image point, the output value of the pixel corresponding to the image point will be largest, and the output values of the surrounding pixels will be greatly reduced. In other words, a distribution is exhibited in which even though the subject light flux passes through either of parallax virtual pupils, the output value of the pixel corresponding to the image point will be largest, and the output values of the surrounding pixels will be greatly reduced, and the respective distributions coincide with each other.

Figure 4B:
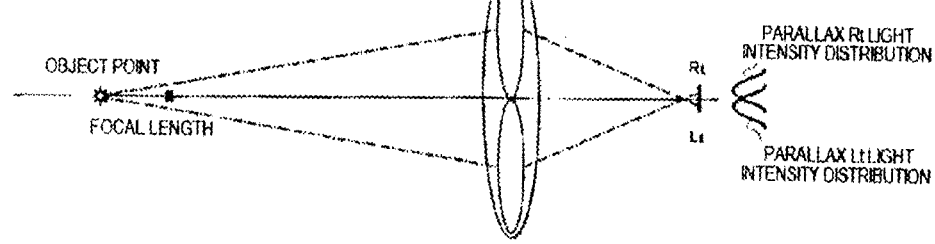

On the other hand, as shown in FIG. 4B, if the object point is shifted from the focal point position in the direction away from the image sensor light receiving surface, compared with the case in which the object point is at the focal point position, the peak of the light intensity distribution exhibited by the parallax Lt pixel will appear at a position shifted in one direction from the pixel corresponding to the image point, and the output value will be reduced. Also, the width of the pixel having that output value will be increased. In other words, the object point has spread in the horizontal direction of the image sensor light receiving surface, so the amount of blurring is increased. The peak of the light intensity distribution exhibited by the parallax Rt pixel will appear at a position shifted in the opposite direction and an equal distance to that of the parallax Lt pixel from the pixel corresponding to the image point, and the output value will likewise be reduced. Also, likewise the width of the pixel having that output value will be increased. In other words, equivalent light intensity distributions, gentler compared with that of the case in which the object point is at the focal position, appear separated by an equal distance. The amount of deviation between the peaks of the light intensity distributions exhibited by the parallax Lt pixel and the parallax Rt pixel corresponds to the amount of parallax.

Figure 4C:
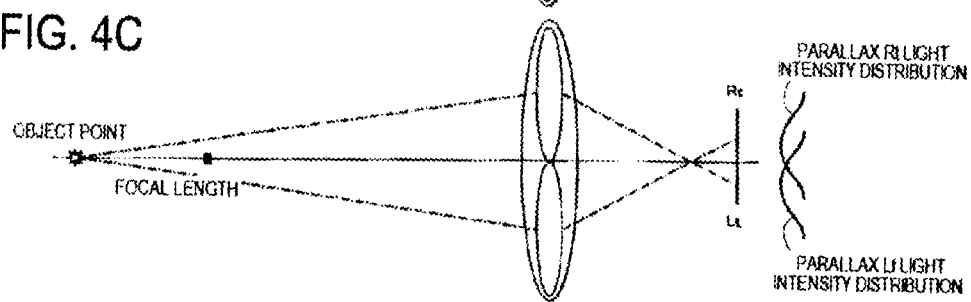

Also, as shown in FIG. 4C, if the object point is shifted even further from the focal position, equivalent light intensity distributions, gentler compared with that of the state shown in FIG. 4B, appear further separated. The spread of the object point increases, so the amount of blurring increases. Also, the deviation between the peaks of the light intensity distributions exhibited by the parallax Lt pixels and the parallax Rt pixels increases, so the amount of parallax increases. In other words, the greater the deviation of the object point from the focal point position, the greater the amount of blur and the amount of parallax.

Figure 4D:
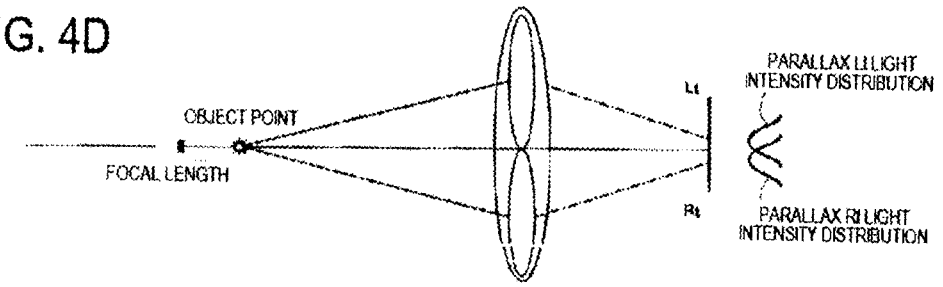

As shown in FIG. 4D, if the object point is shifted from the focal point position in a direction approaching the image sensor light receiving surface, the peak of the light intensity distribution exhibited by the parallax Rt pixel appears at a position separated in one direction from the pixel corresponding to the image point, which is the opposite to the case shown in FIG. 4C. The peak in the light intensity distribution exhibited by the parallax Lt pixel appears at a position separated in the opposite direction to one direction in the case of the parallax Rt pixel. In other words, the object point deviation direction determines whether the position at which the peak of the light intensity distribution exhibited by the parallax Lt pixel and the parallax Rt pixel appears is separated from the pixel corresponding to the image point in one direction or the other direction.

Figure 5A:
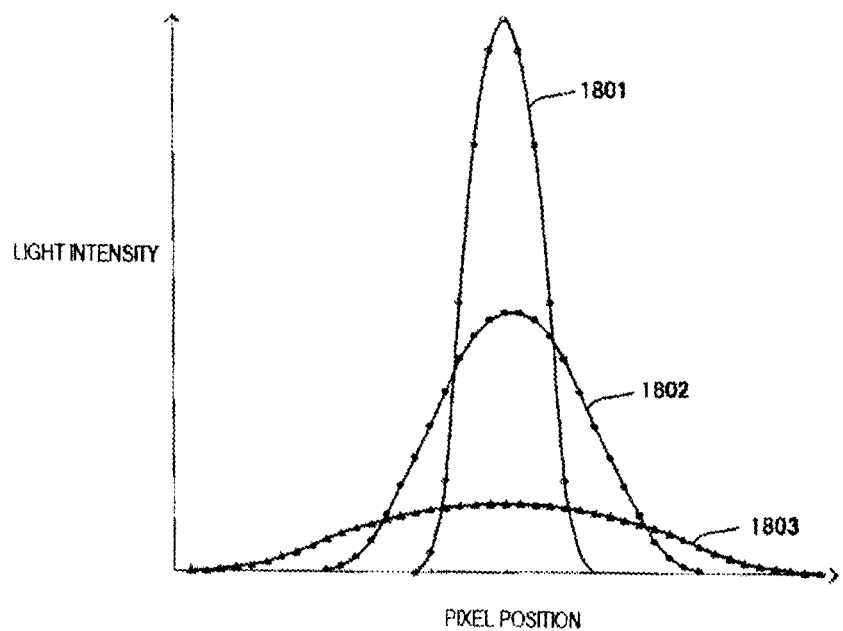
FIGS. 5A and 5B show the light intensity distribution of a non-parallax pixel and a parallax pixel.
Figure 5B:
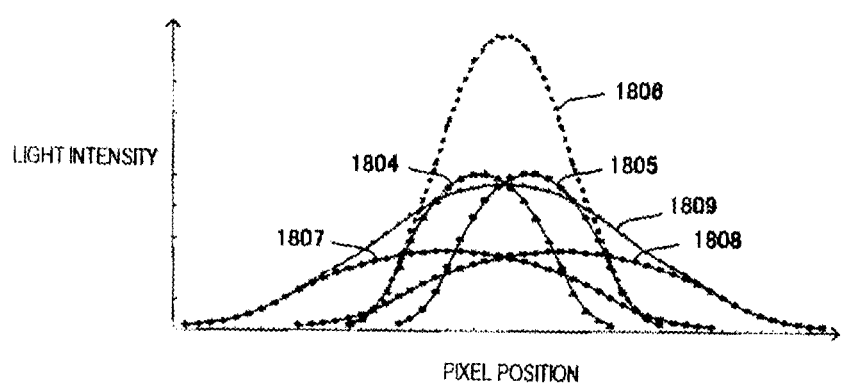

The variations in the light intensity distributions described in FIGS. 3A to 3D and the variations in the light intensity distributions described in FIGS. 4A to 4D are respectively represented by graphs in FIGS. 5A and 5B. FIGS. 5A and 5B show the light intensity distribution of a non-parallax pixel and a parallax pixel. In this drawing, the horizontal axis represents the pixel position, and the center position is the position of the pixel corresponding to the image point. The vertical axis represents the output value of each pixel, these output values are substantially proportional to the light intensity, so in this drawing, it is labeled as the light intensity.

As described above, when the object point is shifted from the focal point position in the direction approaching the image sensor light receiving surface, the light intensity distribution exhibited is the same as when the object point is shifted in the direction away from the image sensor light receiving surface, so in this drawing, the change in the light intensity distribution when shifted in the direction approaching the image sensor light receiving surface is omitted. The peaks in the light intensity distributions exhibited by the parallax Lt pixel and the parallax Rt pixel in the case that the object point is shifted from the focal point position in the direction approaching the image sensors light receiving surface also are the same as the peaks in the light intensity distribution exhibited by the parallax Lt pixel and the parallax Rt pixel in the case that the object point is shifted in the direction away from the image sensor light receiving surface, so it is omitted.

FIG. 5A is a graph showing the variation in the light intensity as described in FIGS. 3A to 3D. The distribution curve 1801 represents the light intensity distribution corresponding to FIG. 3A, and exhibits the steepest form. The distribution curve 1802 represents the light intensity distribution corresponding to FIG. 3B, and the distribution curve 1803 represents the light intensity distribution corresponding to FIG. 3C. It can be seen that compared with the distribution curve 1801, the peak values are gradually reduced, and the form becomes broader.

FIG. 5B is a graph showing the variation in the light intensity as described in FIGS. 4A to 4D. Distribution curve 1804 and distribution curve 1805 represent the light intensity distribution of the parallax Lt pixel and the light intensity distribution of the parallax Rt pixel respectively of FIG. 4B. As can be seen from these graphs, these distributions have a line symmetric shape about the center position. Also, the composite distribution curve 1806 obtained by adding these has a similar shape to the distribution curve 1802 of FIG. 3B which has the same state of defocus as FIG. 4B.

Distribution curve 1807 and distribution curve 1808 represent the light intensity distribution of the parallax Lt pixel and the light intensity distribution of the parallax Rt pixel respectively of FIG. 4C. As can be seen from these graphs, the distributions also have a line symmetric shape about the center position. Also, the composite distribution curve 1809 obtained by adding these has a similar shape to the distribution curve 1803 of FIG. 3C which has the same state of defocus as FIG. 4C. The light intensity distribution of the parallax Lt pixel and the light intensity distribution of the parallax Rt pixel of FIG. 4D are related to the light intensity distribution of the parallax Lt pixel and the light intensity distribution of the parallax Rt pixel of FIG. 4C by exchanging the positions, so they correspond to respectively the distribution curve 1808 and the distribution curve 1807.

Figure 6A:
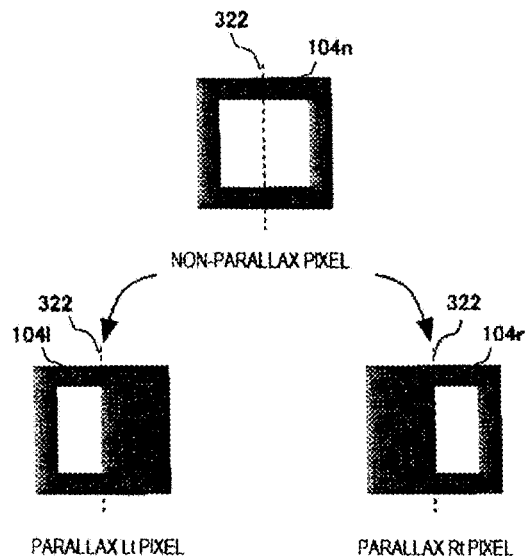
FIGS. 6A, 6B and 6C are explanatory views of the aperture shape of an aperture portion 104 in a case where there are two types of parallax pixels.
Figure 6B:
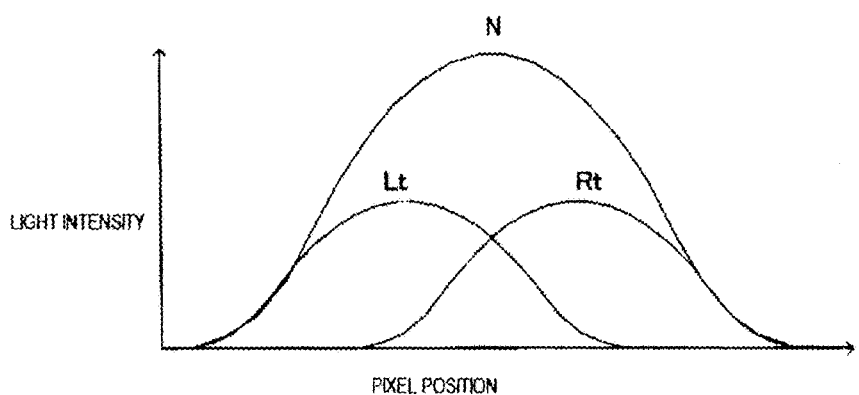
Figure 6C:
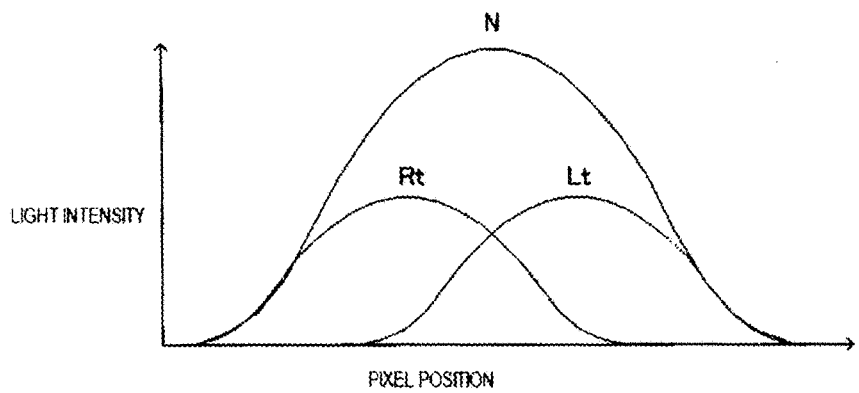

FIGS. 6A to 6C are explanatory views of the aperture shape of the aperture portion 104 in a case where there are two types of parallax pixels. FIG. 6A shows an example in which the shape of the aperture portion 104*l* of the parallax Lt pixel and the shape of the aperture portion 104*r* of the parallax Rt pixel each have the same shape as the shape of an aperture portion 104*n* of a non-parallax pixel divided at the center line 322. In other words, in FIG. 6A, the area of the aperture portion 104*n* of the non-parallax pixel is equal to the sum of the areas of the aperture portion 104*l* of the parallax Lt pixel and the aperture portion 104*r* of the parallax Rt pixel. In this embodiment, the aperture portion 104*n* of the non-parallax pixel is referred to as a fully open aperture, and the aperture portion 104*l* and the aperture portion 104*r* are referred to as half open apertures. If the aperture is positioned in the center of the photoelectric converting element, the aperture is said to be facing the standard direction. The aperture portion 104*l* of the parallax Lt pixel and the aperture portion 104*r* of the parallax Rt pixel are displaced in opposite directions with respect to a virtual center line 322 passing through the center (pixel center) of their corresponding photoelectric converting elements 108. Therefore, the aperture portion 104*l* of the parallax Lt pixel and the aperture portion 104*r* of the parallax Rt pixel produce parallax with respect to the center line 322 in one direction, and the other direction that is opposite to one direction, respectively.

FIG. 6B shows the light intensity distribution for a case in which an object point is shifted from the focal point position in the direction away from the image sensor light receiving surface, when each of the pixels has the apertures shown in FIG. 6A. In this drawing, the horizontal axis represents the pixel position, and the center position is the position of the pixel corresponding to the image point. Also, the curve Lt corresponds to the distribution curve 1804 of FIG. 5B, and the curve Rt corresponds to the distribution curve 1805 of FIG. 5B. The curve N corresponds to a non-parallax pixel, and it has a similar shape to the composite distribution curve 1806 of FIG. 5B. Also, each of the aperture portion 104*n*, aperture portion 104*l*, and aperture portion 104*r* exhibit a function as the aperture diaphragm. Therefore, the width of blurring of the non-parallax pixel having the aperture portion 104*n* whose area is double that of the aperture portion 104*l* (aperture portion 104*r*) is about the same as the width of the blurring of the curve that is the sum of the parallax Lt pixel and the parallax Rt pixel indicated by the composite distribution curve 1806 of FIG. 5B.

FIG. 6C shows the light intensity distribution for a case in which an object point is shifted from the focal point position in the direction approaching the image sensor light receiving surface, when the pixel has the aperture portions shown in FIG. 6A. In this drawing, the horizontal axis represents the pixel position, and the center position is the position of the pixel corresponding to the image point. In the case of the curve Lt and the curve Rt of FIG. 6C, the width of blurring of the non-parallax pixel having the aperture portion 104*n* is about the same as the width of blurring of the curve that is the sum of the parallax Lt pixel and the parallax Rt pixel, and the positional relationship is reversed relative to the curve Lt and the curve Rt of FIG. 6B.

<Depth of Field and Asymmetric Blurring>

Next, the relationship between the depth of field and asymmetry of blurring is described. As can be seen from FIGS. 6B and 6C, in the unfocused region, the width of blurring of the parallax pixels is narrower than the width of blurring of the non-parallax pixels. This means that the lens incident light flux is substantially restricted to the right half and the left half by the aperture mask of the parallax pixels of FIG. 6A. In other words, the single lens pupil produces two virtual pupils, left and right. In other words, the aperture area in the aperture mask of the parallax pixel performs a role that has the same effect as the lens diaphragm.

Normally, when a lens is stopped down, the image captured has a greater depth of field. The aperture of the aperture mask in the left parallax pixel is short in the horizontal direction and long in the vertical direction. Therefore, images with a large depth of field are captured for subjects having a frequency component in the horizontal direction such as vertical lines or the like, and in contrast, images with small depth of field are captured for subjects having a frequency component in the vertical direction such as horizontal lines or the like.

Figure 7A:
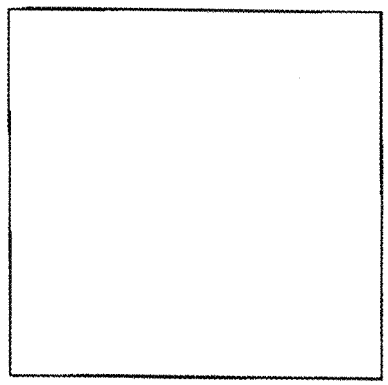
FIGS. 7A, 7B and 7C are explanatory views of asymmetrical blurring.
Figure 7C:
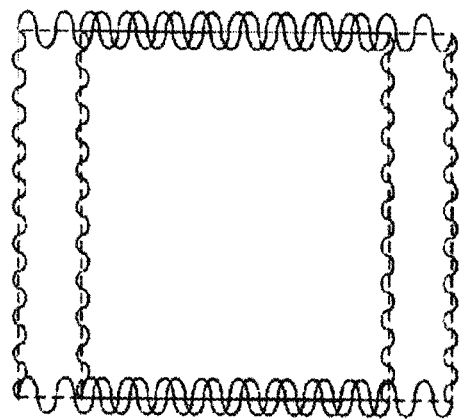
Figure 7B:
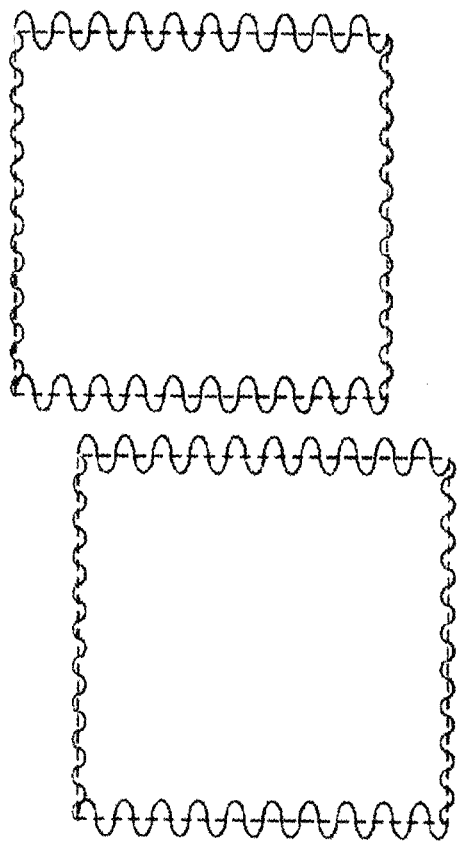

FIGS. 7A to 7C are explanatory views of asymmetrical blurring. For example, when the square patch subject as shown in FIG. 7A is captured, the subject image as shown in FIG. 7A can be obtained in the focused region. In FIG. 7B, the subject images taken by both the left parallax pixels and the right parallax pixels is shown. In the unfocused region, a subject image is taken in which the blurring is small in the horizontal direction and the vertical lines appear sharper than the horizontal lines as shown in FIG. 7B. In other words, the apertures of the aperture mask of the parallax pixels are asymmetrical in the horizontal direction and vertical direction, so the blurring in the horizontal direction and the vertical direction of the subject image is asymmetrical. This can also be referred to as anisotropy of blurring.

If a 2D image is obtained from a 3D image displayed as the superposition of the subject image for the left eye and the subject image for the right eye of FIG. 7B, undesirable blurring in the form of double line blurring caused by sharp blurring in the horizontal direction in the 2D images occurs (FIG. 7C). Therefore, it is desirable to perform a correction to enable natural blurring to be obtained by reducing the asymmetric blurring of the left and right parallax images for displaying 3D images, or a correction to enable natural blurring in which double line blurring does not occur in 2D image display by image processing.

Figure 8A:
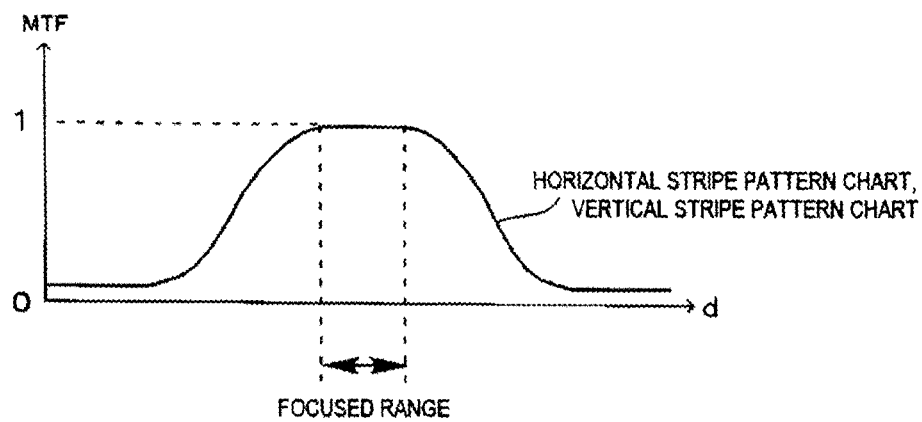
FIGS. 8A and 8B show the relationship between depth of field and parallax images and non-parallax images.
Figure 8B:
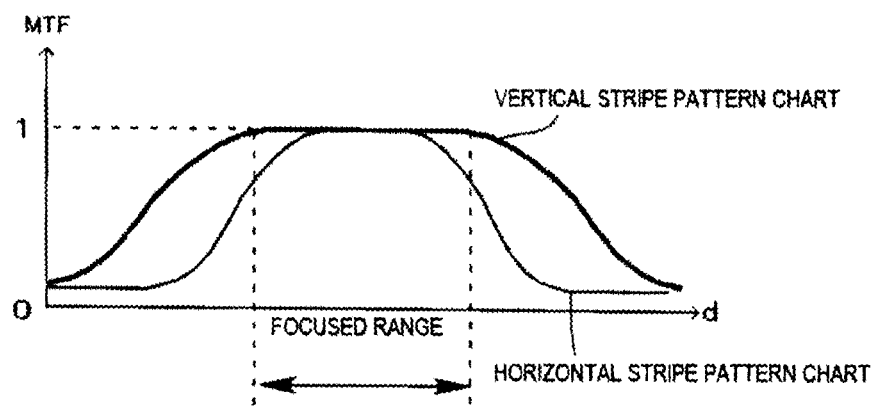

FIGS. 8A and 8B show the relationship between parallax images and non-parallax images and depth of field. Specifically, FIGS. 8A and 8B show the subject distance dependency of the modulation transfer function (MTF) properties for a vertical stripe pattern chart when a stripe pattern chart of the subject image for a pixel pitch of a (mm) and a frequency of f (No./mm) in the image sensor 100 is captured and a horizontal line stripe pattern chart when the stripe pattern chart is rotated by 90° and captured. The vertical axis represents the MTF, and the horizontal axis represents the distance d from the digital camera 10. If the MTF in the MTF distribution is 1 near the optical axis of the focus position, the reduction with distance of the stripe pattern chart forward or backward from the focus position is shown. FIG. 8A shows the MTF distribution of a vertical stripe pattern chart and a horizontal stripe pattern chart in a non-parallax image (N image) for a subject distance of a constant frequency subject image. As shown in FIG. 8A, in the non-parallax image, the MTF distributions of the vertical stripe pattern chart and the horizontal stripe pattern chart coincide. FIG. 8B shows the MTF distribution of a vertical stripe pattern chart and a horizontal stripe pattern chart in a parallax image (parallax Lt image and parallax Rt image) for a subject distance of a constant frequency subject image. The MTF distribution of the horizontal stripe image pattern chart shown in FIG. 8B coincides with the MTF of the horizontal stripe pattern chart shown in FIG. 8A. On the other hand, the MTF distribution of the vertical stripe pattern chart shown in FIG. 8B indicates a broader high contrast region in the distribution, and a greater depth of field compared with the MTF distribution of the vertical stripe pattern chart shown in FIG. 8A. In other words, if the stripe pattern charts are moved forward or backward from the focus position, the contrast would be different in the horizontal stripe pattern chart and the vertical stripe pattern chart in the parallax images. This produces the asymmetry of blurring shown in FIGS. 7A to 7C as discussed previously.

<Algorithm Design Principles>

Next, an algorithm to correct the asymmetry of blurring or the double line blurring produced in 2D images is described. In order to appropriately process the blurring correction, it is necessary to determine the amount of blurring. Although described in detail later, in the single lens pupil divided stereoscopic image-capturing system, a disparity map is produced, effectively utilizing the fact that the magnitude of blurring is directly connected to the disparity. In other words, in the disparity map, the degree of separation of the blurring in the left and right parallax images in the horizontal direction is evaluated. The larger the degree of separation of the blurring, the larger the amount of blurring, so the disparity map may also be said to be a map of the degree of blurring of the subject image.

Figure 9A:
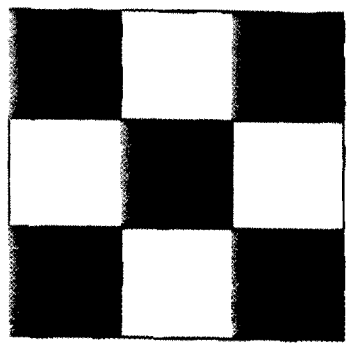
FIGS. 9A, 9B, 9C and 9D are explanatory views of filtering.

The following is a description of how the filter processing unit 233 carries out filtering using the disparity map. FIGS. 9A to 9D are explanatory views of filtering. Here, an example of image capture of a checkerboard pattern is described. In the drawing, FIG. 9A shows the case in which the image of the checkerboard pattern is captured in the focused region. In the focused region, the amount of blurring in both the horizontal direction and the vertical direction is 0.

Figure 9B:
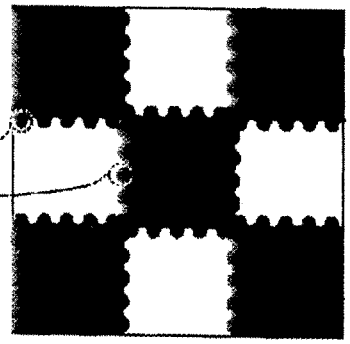
Figure 9C:
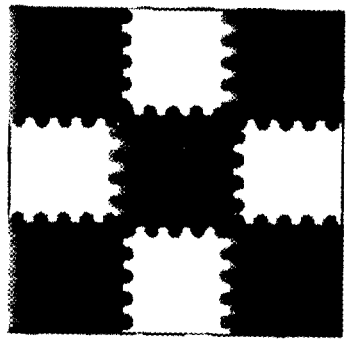

FIG. 9B shows a case in which the image of the checkerboard pattern is captured in the unfocused region. In the unfocused region, blurring is produced in both the vertical direction for horizontal lines and in the horizontal direction for vertical lines. Here, the amount of blurring in the vertical direction for horizontal lines is different from the amount of blurring in the horizontal direction for vertical lines. In more detail, as shown in the drawing, the amount of blurring in the vertical direction in the horizontal lines is larger than the amount of blurring in the horizontal direction in the vertical lines. Although described in detail later, in the following embodiment, the filter processing unit 233 uses the disparity map to perform an asymmetrical smoothing process between the horizontal direction and the vertical direction in order to perform correction so as to eliminate asymmetry of blurring. Specifically, the filter processing unit 233 uses the disparity map and derives the Gaussian blur radius corresponding to the amount of blurring in the horizontal direction of the vertical lines corresponding to a certain pixel. The filter processing unit 233 filters the pixel values of the pixels using the Gaussian blur radius. By carrying out this process on all the pixels, the amount of blurring in the vertical direction for the horizontal lines is maintained, and the amount of blurring in the horizontal direction for the vertical lines is increased as shown in FIG. 9C.

Figure 9D:
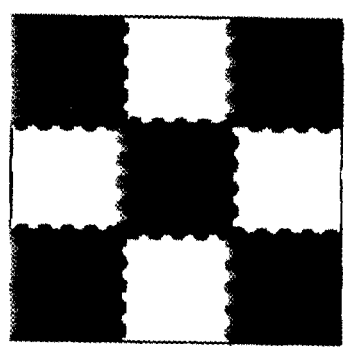

Also, when carrying out edge enhancement, the filter processing unit 233 may carry out strong edge enhancement on the subject image of horizontal lines that are greatly blurred, and carry out weak edge enhancement on the subject image of vertical lines that have little blurring, in order to correct and eliminate the blurring asymmetry. Specifically, using the disparity map, the filter processing unit 233 may derive the edge enhancement gain coefficient corresponding to a certain pixel. The filter processing unit 233 corrects the pixel value of the pixel using the gain coefficient. By carrying out the process on all the pixels to correct the pixel value of the pixel using the gain coefficient, the filter processing unit 233 can reduce the amount of blurring in the vertical direction while maintaining the amount of blurring in the horizontal direction, as shown in FIG. 9D.

Embodiment 1

Figure 10:
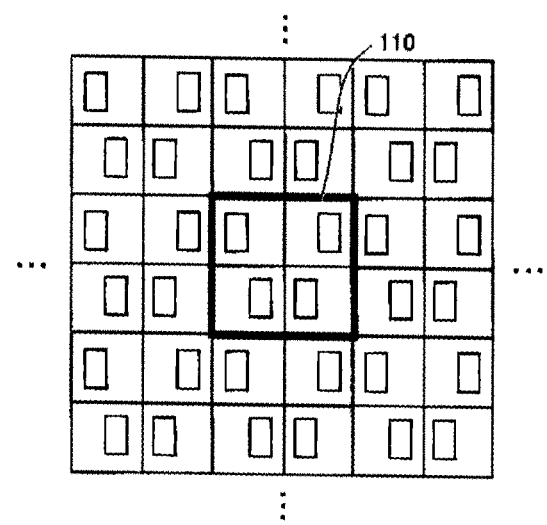
FIG. 10 shows an example of a pixel array.
Figure 10:
Figure 10:

Correction of Asymmetry Blurring by Smoothing in Horizontal Direction Parallax Lt Images and Parallax Rt Images The image processing procedure is generally as follows.
1) Input parallax multiplexed mosaic image data
2) Generate parallax image
3) Correct asymmetrical blurring by smoothing the parallax image
  3-1) Generate disparity map
  3-2) Smoothing Process
The following is a description of the procedure.
1) Input Parallax Multiplexed Mosaic Image Data FIG. 10 shows an example of a pixel array. The image sensor 100 uses the 2×2 pixel pattern 110 indicated by the thick line in the drawing as a primitive lattice. In the pattern 110, the top left pixel and the bottom right pixel are allocated to parallax Lt pixels. The bottom left pixel and the top right pixel are allocated to parallax Rt pixels. Here, the image sensor 100 is a monochrome sensor.

A single plate type monochrome mosaic image in which the parallax of FIG. 10 is multiplexed is represented as M(x, y). The gradation is assumed to be linear gradation output by A/D conversion.

2) Generate Parallax Image

The image data generating unit 231 generates a left parallax image and a right parallax image. In other words, the image data generating unit 231 generates the left parallax image by interpolation within a signal plane in which only the left parallax pixels are gathered. The interpolation is carried out using the pixel values of the adjacent pixels vertically or horizontally. Four point simple average interpolation may be carried out, but to produce a higher definition left parallax image, the interpolation values may be calculated by comparing the absolute value of the vertical pixel difference and the absolute value of the horizontal pixel difference, and determining the direction from the direction with the smallest value and largest correlation. Likewise, the image data generating unit 231 generates the right parallax image by carrying out interpolation within a signal plane in which the right parallax pixels only are gathered. In other words, from $Lt_{mosaic}(x, y)$, $Lt(x, y)$ is generated, and from $Rt_{mosaic}(x, y)$, $Rt(x, y)$ is generated.

The left parallax image is represented as $Lt(x, y)$.

The right parallax image is represented as $Rt(x, y)$.

3) Correct Asymmetrical Blurring by Smoothing the Parallax Image 3-1) Generate Disparity Map First, the concept of the method of detecting disparity is described. Although described in detail later, in the single lens pupil divided image-capturing system, if the width of blurring of the subject image is estimated, the amount of disparity is equivalently detected.

Figure 11A:
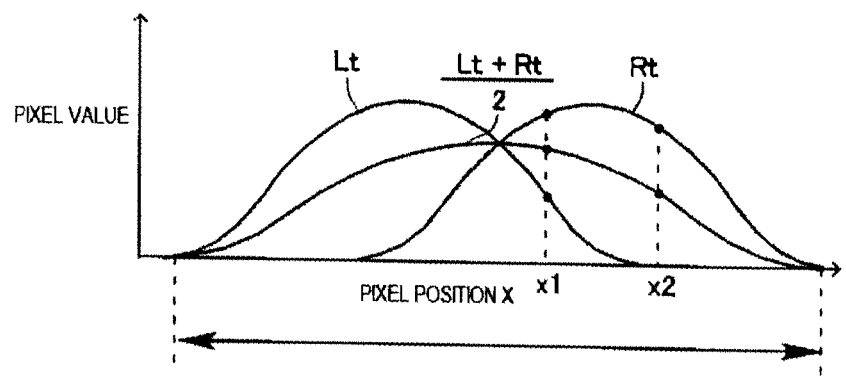
FIGS. 11A and 11B show the point spread of an object point in the unfocused region.
Figure 11B:
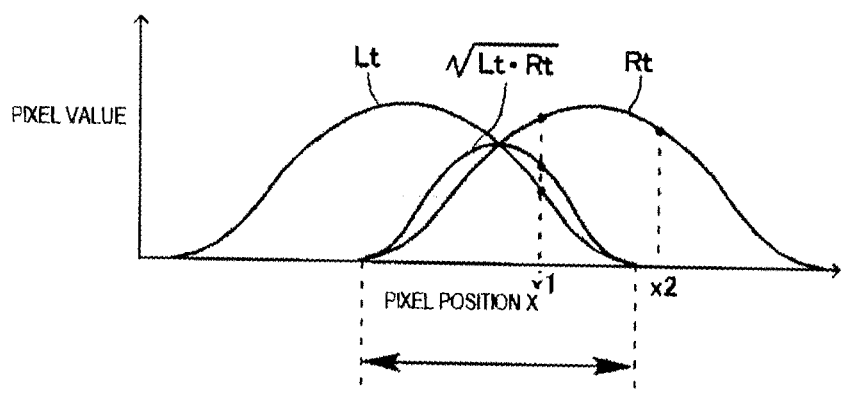

FIGS. 11A and 11B show the point spread of an object point in the unfocused region. In this drawing, the horizontal axis represents the pixel position, and the center position is the position of the pixel corresponding to the image point. The vertical axis represents the pixel value. In FIGS. 11A and 11B, the left view point point spread Lt and the right view point point spread Rt exhibit the width of blurring in the horizontal direction in a case where the aperture of the left and right parallax pixels shown in FIGS. 6A to 6C are half open.

The left view point point spread Lt and the right view point point spread Rt of FIG. 11A are represented as functions of the pixel position x. The arithmetic average of the left view point point spread Lt and the right view point point spread Rt is also represented as a function of the pixel position x. For example, at the pixel position x1, Lt and Rt have the pixel values, so the calculation result is a positive value. At the pixel point x2, although Lt does not have a pixel value, Rt has a pixel value, so the calculation result is a positive value. When calculating the arithmetic average, the calculation result is a positive value if either of Lt or Rt has a pixel value, as in the cases above. Therefore, overall the arithmetic average of the point spread Lt and the point spread Rt at each pixel position is the sum of the width of the spread of the point spreads Lt and Rt, as shown in FIG. 11A. This corresponds to the width of blurring corresponding to the non-parallax pixel having the fully open aperture shown in FIGS. 6A to 6C.

Note that the arithmetic average is an example of calculation to obtain the sum of the width of spread of the point spreads Lt and Rt. Other calculations may be used provided they are capable of obtaining the sum of the width of spread of the point spreads Lt and Rt.

The geometric average of the left view point point spread Lt and the right view point point spread Rt is also represented as a function of the pixel position x. For example, at the pixel position x1, Lt and Rt have the pixel values, so the calculation result is a positive value. Other hand, at the pixel position x2, although Rt has a pixel value, Lt does not have a pixel value, so the calculation result is 0. When calculating the geometric average as described above, when both Lt and Rt have a pixel value, calculation result is a positive value. Therefore, overall the geometric average of the point spread Lt and the point spread Rt at each pixel position is the product of the width of the spread of the point spreads Lt and Rt, as shown in FIG. 11B. The width of spread of the geometric average is lower compared with the arithmetic average, and becomes relatively further smaller as the amount of disparity increases, so their ratio is also correlated to the amount of disparity.

Note that the geometric average is an example of calculation to obtain the product of the width of spread of the point spreads Lt and Rt. Other calculations may be used provided they are capable of obtaining the product of the width of spread of the point spreads Lt and Rt. Normally, a subject can be considered to be a collection of object points, so the image can be considered to be the integration of the point image of each object point. Therefore, the blurring of an image can be considered in the same way as the blurring of the point spread as described above The width of blurring of the subject image differs depending on whether the arithmetic average or the geometric average has been applied. On the other hand, for the image structure, it does not matter which of the arithmetic average or the geometric average is applied. In other words, if the average is taken of the left view point image and the right view point in an actual subject, a subject image is produced having the same image structure at the same pixel positions, and it is possible to form subject images with different widths of blurring when either the arithmetic average or the geometric average is applied. In order to represent this schematically, it is assumed that the distribution of the image structure of a subject forming an ideal image that represents the point spread function of the subject image as all delta functions $\delta(x, y)$ is $I(x, y)$, the point spread function of the width of blurring due to the geometric average of the optical system is $B_{AND}(x, y)$, and the point spread function of the width of blurring due to the arithmetic average is $B_{OR}(x, y)$, the ratio of the widths of blurring of the point spread functions of the subject image $R(x, y)$ is determined as follows. Here, if the point spread function of the left view point parallax image is $B_L(x, y)$, and the point spread function of the right view point parallax image is $B_R(x, y)$, the left parallax image is represented by the product $I(x, y) \otimes B_L(x, y)$, and the right parallax image is represented by the product $I(x, y) \otimes B_R(x, y)$. $B_{AND}(x, y)$ is the geometric average of $I(x, y) \otimes B_L(x, y)$ and $I(x, y) \otimes B_R(x, y)$, and $B_{OR}(x, y)$ is the arithmetic average of $I(x, y) \otimes B_L(x, y)$ and $I(x, y) \otimes B_R(x, y)$. The actual pixel value in each pixel of the left parallax image is represented by the product of $I(x, y)$ and $B_L(x, y)$, and the actual pixel value in each pixel of the right parallax image is represented by the product of $I(x, y)$ and $B_R(x, y)$. In other words, the pixel value of each pixel of the left parallax image and the right parallax image is inherent in $I(x, y)$. Therefore, if the ratio of the arithmetic average and the geometric average is taken for each pixel, the information regarding the image structure is substantially eliminated, and only the information regarding the ratio of the width of blurring of the subject image remains.

[Formula 1]

$$\frac{B_{OR}(x,y) \otimes I(x,y)}{B_{AND}(x,y) \otimes I(x,y)} = \frac{B_{OR}(x,y)}{B_{AND}(x,y)} = R(x,y) \geq 1 \quad \text{(Formula 1)}$$

Also, the width of blurring and the amount of disparity in the subject image is affected by the optical conditions. For example, when an image is captured with an aperture value of F1.4, the width of blurring will be wider than in the case where the image is captured at F8. In other words, the width of blurring is affected by the aperture value when the image is captured. Also, the amount of disparity is greater when an image is taken with an aperture value of F1.4 than when an image is taken at F8. In other words, the amount of disparity is also affected by the aperture value when the image is taken. Therefore, a difference is produced in the width of blurring and the amount of disparity depending on the aperture value. When the ratio of the arithmetic average and the geometric average is taken for each pixel, the amount of disparity can be calculated in accordance with the aperture value. Information regarding the ratio of the width of blurring of a subject image can be used to express information on distance from the focal point surface using the relationship shown in FIGS. 4A to 4D.

Taking into consideration the property inherent in the single lens pupil divided image-capturing system that as the width of blurring increases, the disparity increases, then the greater the disparity, the greater the ratio of the arithmetic average and the geometric average. This is because the relationship between the arithmetic average and the geometric average corresponds to the relationship between sum and product. With an object in the focused region, the point spread of the left parallax and the point spread of the right parallax coincide, so the results of the arithmetic average and the geometric average also coincide. Therefore, the value of the ratio of the arithmetic average and the geometric average is 1 or greater. The value of the ratio of the arithmetic average and the geometric average is 1 in the focused region, and the further the object is separated from the focused region, the greater the value. Experimentally it is found that the maximum value of the ratio obtained under the condition that the aperture diaphragm of the lens is in the open position, which maximizes the disparity, falls within the range about 2. r(x, y) represents the ratio of the width of blurring of each pixel, so it is possible to use it as a map of the ratio of the width of blurring.

[Formula 2]

$$r(x,y) = \frac{\frac{Lt(x,y) + Rt(x,y)}{2}}{\sqrt{Lt(x,y) \cdot Rt(x,y)}} \quad \text{(Formula 2)}$$

where, $1 \leq r \leq \sim 2$.

Therefore, if D(x, y)=r(x, y)−1, in other words, if the following (Formula 3) is defined, the disparity is zero in the focused region, and in the unfocused region, an index can be obtained that increases the value of the disparity.

[Formula 3]

$$D(x,y) = \frac{\frac{Lt(x,y) + Rt(x,y)}{2}}{\sqrt{Lt(x,y) \cdot Rt(x,y)}} - 1 \quad \text{(Formula 3)}$$

where, $0 \leq D \leq \sim 1$.

D(x, y) represents a two-dimensional map of each of the pixels, so it is possible to define it as it is as the disparity map.

In the disparity map, evaluation data can be obtained in which the effects of the image structure is eliminated and the degree of blurring is continuously varied. The disparity map is an index representing the extent of blurring of the object structure in a blurred portion, and at the same time, has the property that values at edge portions only are detected and the values at the flat portions are eliminated. In addition, the regions of the image structure where edge portions can be detected having even a small amount of disparity in the horizontal direction are limited to regions outside the focused region. Therefore, disparity is not detected in the object structure of a complete horizontal lateral line, but as the angle is gradually raised toward the vertical direction, it is possible to obtain a disparity map having finite values. In other words, a disparity map is obtained for the degree of blurring of the object as well as for regions where the object structure is changing in the horizontal direction. A disparity map obtained in this way is an extremely effective index in which the region where the asymmetry of blurring of the target object is to be corrected coincides with its intensity distribution.

3-2) Smoothing Process

In order to convert the disparity map into the absolute disparity amount expressed in units of the number of pixels, as shown the following (Formula 4), the constant $\sigma_0$ in which the width of blurring is defined by the number of pixels may be multiplied by (Formula 3). The constant $\sigma_0$ is defined in relation to the image-capturing area of the image sensor 100, the pixel pitch, and the optical system, and is in the order of the maximum disparity between the left and right parallax images. For example, the constant $\sigma_0$ has a value in the order of 50 pixels, or 100 pixels. This absolute disparity amount is set as the blur radius of the Gaussian blur filter, and Gaussian blurring is carried out in the horizontal direction. In other words, adaptive Gaussian blurring is carried out that changes as the blur radius changes with the pixel position. In this way, in locations where the value of the disparity map is large, the blurring is strong in the horizontal direction, and in locations where the disparity is zero, no blurring is carried out. In other words, in regions where the horizontal blurring is weak, strong blurring is carried out in the horizontal direction, and in regions where the vertical blurring is strong, no processing is carried out. Also, no processing is carried out also in flat regions. Therefore, as a result, the filter processing unit 233 carries out the filtering excluding the focused region.

$$\sigma(x,y) = \sigma_0 D(x,y) \quad \text{(Formula 4)}$$

The coefficient distribution can be represented by (Formula 5).

$$F(x-x', y) = \frac{\exp\left(-\frac{|x-x'|^2}{\sigma(x,y)^2}\right)}{\int_{|x-x'| \leq 2\sigma(x,y)} \exp\left(-\frac{|x-x'|^2}{\sigma(x,y)^2}\right) dx'} \quad \text{(Formula 5)}$$

The horizontal blurring process carried out on the left parallax image can be represented by (Formula 6).

$$Lt'(x, y) = F \otimes Lt(x, y) = \frac{\int_{|x-x'| \leq 2\sigma(x,y)} Lt(x-x', y) F(x-x', y) dx'}{\int_{|x-x'| \leq 2\sigma(x,y)} F(x-x', y) dx'}$$ (Formula 6)

The horizontal blurring process carried out on the right parallax image can be represented by (Formula 7).

$$Rt'(x, y) = F \otimes Rt(x, y) = \frac{\int_{|x-x'| \leq 2\sigma(x,y)} Rt(x-x', y) F(x-x', y) dx'}{\int_{|x-x'| \leq 2\sigma(x,y)} F(x-x', y) dx'}$$ (Formula 7)

There are two methods of varying the correction strength. One method is to vary the value of the constant $\sigma_0$ which is the standard value of the radius of blurring as described above within the range 0 to $\sigma_0$. Another method is to perform a weighted composition of the correction results with the original image while the constant value $\sigma_0$ which is the standard value of the radius of blurring is not varied. In other words, if the weighting ratio $\alpha=0$ to 1, the following (Formula 8) and (Formula 9) can be used.

$$Lt''(x,y)=(1-\alpha)\cdot Lt(x,y)+\alpha\cdot Lt'(x,y)$$ (Formula 8)

$$Rt''(x,y)=(1-\alpha)\cdot Rt(x,y)+\alpha\cdot Rt'(x,y)$$ (Formula 9)

Alternatively, the two methods may be used in combination. In this way, the parallax images are obtained with the asymmetric blurring corrected with an arbitrary strength.

Embodiment 2

Correction of Asymmetric Blurring by Suppression of Horizontal Edge Enhancement on Parallax Lt Image and Parallax Rt Image The image processing procedure is generally as follows.
1) Input parallax multiplexed mosaic image data
2) Generate parallax image
3) Correct asymmetric blurring by edge enhancement of parallax images
3-1) Generate disparity map
3-2) Edge enhancement process
This is the same as Embodiment 1 apart from step 3-2), so in the following, the description is omitted.
3-2) Edge Enhancement Process In order that the asymmetry of blurring of the parallax image shall approach a symmetrical direction, a process to strengthen the edge enhancement in the horizontal line object structure region where the vertical blurring is strong is carried out, and a process to weaken the edge enhancement in the vertical line object structure region where the horizontal blurring is weak and the sharpness is maintained is carried out.

First, the edge component is extracted by the following Laplacian filter. However, this is an example, and normally, the Laplacian component may be defined as the difference between the typical two-dimensional Gaussian blurred result in an arbitrary radius and the original image, which is referred to as an unsharp mask.

$$\Delta = \frac{1}{144} \cdot \begin{array}{|c|c|c|c|c|} \hline -1 & -3 & -4 & -3 & -1 \\ \hline -3 & -10 & -15 & -10 & -3 \\ \hline -4 & -15 & 144 & -15 & -4 \\ \hline -3 & -10 & -15 & -10 & -3 \\ \hline -1 & -3 & -4 & -3 & -1 \\ \hline \end{array}$$

Also, the edge enhancement gain coefficient k is set so that it varies in pixel units. At this time, the disparity map information is used. The following two examples can be considered as the gain coefficient.

$$k(x, y) = k_0 \frac{1}{r(x, y)}$$ (Formula 10)

$$k(x, y) = k_0 [1 - D(x, y)]$$ (Formula 11)

However, in (Formula 11), the value of k is zero or higher, and for negative values, it is clipped to 0. Also, the second term of (Formula 10) and (Formula 11) may be raised to the power of 2 to change the strength scale of the blurring ratio map and the disparity map.

In this way, the defined gain coefficient map k(x, y) play the role of weakening the degree of edge enhancement in regions where the horizontal blurring of vertical lines is weak. This is because the greater the disparity in a region, the stronger the asymmetry of blurring between the horizontal direction and vertical direction, and in such regions which are regions where the blurring ratio r is close to 2 and the parallax D is close to 1, the value of the gain coefficient is defined to be smallest.

Using these gain coefficients, the asymmetry of blurring in the left parallax image and the right parallax image is corrected.

$$Lt'(x,y)=Lt(x,y)+k(x,y)\Delta Lt(x,y)$$ (Formula 12)

$$Rt'(x,y)=Rt(x,y)+k(x,y)\Delta Rt(x,y)$$ (Formula 13)

However, in order to change the degree of edge enhancement of the overall image, the value of $k_0$ may be set to an arbitrary positive value equal to or greater than 0.

Embodiment 3

Correction of Asymmetrical Blurring in N Image by Horizontal Smoothing

By arranging non-parallax pixels at a higher density than parallax pixels, it is possible to reproduce high-resolution 2D images with no parallax. At this time, high resolution can be realized by referring to the values of the parallax Lt pixels and the parallax Rt pixels for interpolation of the N pixels. The local gain balance correction described below performs this role. After obtaining a high resolution 2D image as an intermediate image (N image), parallax modulation in the left direction and right direction is added to the N image using the low-resolution parallax Lt image generated by interpolation using only the pixel values of the parallax Lt image and the parallax Rt image generated by interpolation using only the pixel values of the parallax Rt pixels. In this way, a high resolution parallax Lt image and a high resolution Rt image are generated. In this embodiments described below, these are enabled.

The N image obtained by this procedure includes asymmetrical blurring between the parallax Lt image and the parallax Rt image referenced in order to achieve high resolution, so the N image tends to exhibit double line blurring, although the double line blurring is not as strong as that described in Embodiments 1 and Embodiment 2. The following is an embodiment that reduces the double line blurring of this N image.

Figure 12:
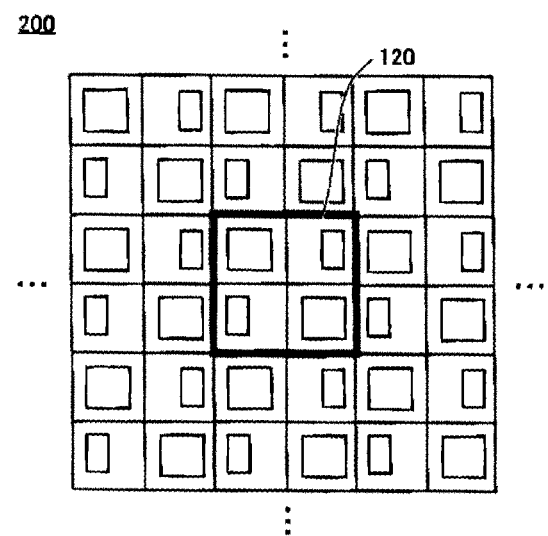
FIG. 12 shows a variation in the pixel array.
Figure 12:
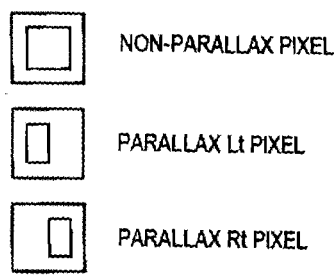

The image processing procedure is generally as follows.
1) Input parallax multiplexed mosaic image data
2) Generate temporary parallax image
3) Generate standard images with no parallax by performing local brightness distribution correction between the left and right pixels
 (local gain balance correction)
4) Correct asymmetrical blurring by smoothing the standard image
5) Generate actual parallax images The following is a description of the procedure.
1) Input Parallax Multiplexed Mosaic Image Data FIG. 12 shows a variation in the pixel array. The image sensor 200 uses the 2×2 pixel pattern 120 indicated by the thick line in the drawing as a basic lattice. In the image sensor 200, in the pattern 120, non-parallax pixels are allocated to the top left pixel and the bottom right pixel. Also, a parallax Lt pixel is allocated to the bottom left pixel, and a parallax Rt pixel is allocated to the top right pixel. Here, the image sensor 100 is a monochrome sensor. A single plate type monochrome mosaic image in which the parallax of FIG. 12 is multiplexed is represented as M (x, y). The gradation is assumed to be linear gradation output by A/D conversion.

2) Generate Temporary Parallax Image

The image data generating unit 231 generates a temporary left parallax image and a temporary right parallax image with low spatial frequency resolution capability. Specifically, the image data generating unit 231 carries out simple average interpolation within a signal plane on which only the left parallax pixels are gathered. Using the pixel values of the adjacent pixels, linear interpolation is carried out in accordance with the ratio of distance. Likewise, the image data generating unit 231 carries out simple average interpolation within a signal plane on which only the right parallax pixels are gathered. Likewise, the image data generating unit 231 carries out simple average interpolation within a signal plane on which only the non-parallax pixels are gathered. In other words, from $Lt_{mosaic}(x, y)$ Lt(x, y) is generated, from $Rt_{mosaic}(x, y)$ Rt(x, y) is generated, and from $N_{mosaic}(x, y)$ N(x, y) is generated.

The temporary non-parallax image is represented as N(x, y).

The temporary left parallax image is represented as Lt(x, y).

The temporary right parallax image is represented as Rt(x, y).

Note that when producing the temporary non-parallax image N(x, y), it is desirable that it be carried out at high definition introducing directional determination within the signal planes. The method is the same as described for interpolation of the parallax Lt image and the parallax Rt image in Embodiment 1. In other words, directional determination is carried out between the vertical direction and the horizontal direction, and interpolation of the N pixels is carried out using the pixel values in the direction with the strong correlation.

Likewise, the same concept can be used when producing the temporary left parallax image and the temporary right parallax image. In other words, using the concepts disclosed in Japanese Patent No. 4748278 (of the same inventors as the present application), initially, the pixel values in the two diagonally inclined directions are interpolated. In addition, interpolation of the remaining missing pixels is carried out in two stages by calculating the interpolation values using the pixel values in the vertical and horizontal directions that have been filled in with the original sampling pixels and interpolated pixels. In the first stage, the amount of correlation is calculated between the two diagonal directions, and interpolation is carried out using the pixel values in the direction with the strong correlation. In the second stage, the amount of correlation is calculated between the vertical and horizontal directions, and interpolation is carried out using the pixel values in the direction with the strong correlation.

3) Generate Standard Images with No Parallax by Performing Local Brightness Distribution Correction Between the Left and Right Pixels
(Local Gain Balance Correction)

Next, by carrying out the local gain correction in pixel units, first, the brightness of the left parallax pixels within the screen and the right parallax pixels within the screen are adjusted. As a result of this operation, the left and right parallax is eliminated. In addition, the brightness is further adjusted between the signal plane for which the left and right average has been taken and the image-capturing signal plane of the non-parallax pixels. In this way, a new standard image plane with no parallax is produced with adjusted gain for all the pixels. This is equivalent to substituting with the average values m(x, y), so an intermediate image plane is obtained in which the parallax is eliminated. This is also written again as N(x, y).

Average value of each pixel $$m(x, y) = \sqrt{N(x, y) \cdot \frac{Lt(x, y) + Rt(x, y)}{2}}$$

Gain value for each pixel for non-parallax pixels $$g_N(x, y) = \frac{m(x, y)}{N(x, y)} = \sqrt{\frac{Lt(x, y) + Rt(x, y)}{2N(x, y)}}$$

Gain value of each pixel for left parallax pixels $$g_{Lt}(x, y) = \frac{m(x, y)}{Lt(x, y)} = \sqrt{\frac{N(x, y)}{Lt(x, y)} \cdot \frac{Lt(x, y) + Rt(x, y)}{2Lt(x, y)}}$$

Gain value of each pixel for right parallax pixels $$g_{Rt}(x, y) = \frac{m(x, y)}{Rt(x, y)} = \sqrt{\frac{N(x, y)}{Rt(x, y)} \cdot \frac{Lt(x, y) + Rt(x, y)}{2Rt(x, y)}}$$

Local gain correction for each pixel for non-parallax pixels $$N(x,y) \cdot g_N(x,y) = m(x,y)$$

Local gain correction for each pixel for left parallax pixels $$Lt(x,y) \cdot g_{Lt}(x,y) = m(x,y)$$

Local gain correction for each pixel for right parallax pixels $$Rt(x,y) \cdot g_{Rt}(x,y) = m(x,y)$$

In this way, a monochrome plane image N(x, y) having no parallax is output by rewriting the monochrome plane data in such a manner that the average values between the left view point image and the right view point image is calculated and then averaged with the value of the standard view point image with no parallax as new non-parallax pixel values. The standard view point image N(x, y) is generated using the average values of the left view point image and the right view point image, so it is an image based on the parallax image data.

4) Correct Asymmetrical Blurring by Smoothing the Standard Image

The filter processing unit 233 relieves the double line blurring structure included in the blurring of the subject image of the N image by smoothing. The principle of the correction is the same as that in Embodiment 1 in which high contrast horizontal blurring is smoothed. The calculations carried out are the same as those defined in (Formula 2) to (Formula 5). Next, smoothing in the horizontal direction is carried out on the N image.

The horizontal blurring process carried out on the non-parallax image can be represented by (Formula 14).

$$N'(x, y) = \qquad \text{(Formula 14)}$$

$$F \otimes N(x, y) = \frac{\int_{|x-x'| \le 2\sigma(x,y)} N(x-x', y)F(x-x', y)dx'}{\int_{|x-x'| \le 2\sigma(x,y)} F(x-x', y)dx'}$$

In this way, a non-parallax image N'(x, y) is generated in which the double line blurring is suppressed.

5) Generate Actual Parallax Images

Using the low-resolution temporary left parallax image Lt(x, y) generated in step 2 and the high-resolution non-parallax monochrome image N'(x, y) generated as an intermediate process in steps 3 and 4, the image data generating unit 231 generates the high-resolution left parallax monochrome image Lt'(x, y) that is actually output. Likewise, using the low-resolution temporary right parallax image Rt(x, y) generated in step 2 and the high-resolution non-parallax monochrome image N(x, y) generated as an intermediate process in steps 3 and 4, the image data generating unit 231 generates the high-resolution right parallax color image Rt(x, y) that is actually output.

The left parallax modulation can be represented by (Formula 15).

$$Lt'(x, y) = N'(x, y) \frac{2Lt(x, y)}{Lt(x, y) + Rt(x, y)} \qquad \text{(Formula 15)}$$

The right parallax modulation can be represented by (Formula 16).

$$Rt'(x, y) = N'(x, y) \frac{2Rt(x, y)}{Lt(x, y) + Rt(x, y)} \qquad \text{(Formula 16)}$$

In this way, the high-resolution left parallax image and the high-resolution right parallax image in which the double line blurring is suppressed are generated.

Here, a method of controlling the weakening of the three-dimensional effect by parameterization of the amount of modulation when carrying out parallax modulation is briefly described, with the objective of connecting to the description of Embodiment 4 below. By parameterization of the amount of modulation when carrying out the parallax modulation, it is possible to control the amount of disparity. When the amount of disparity changes, the view point of the left parallax image data and the view point of the right parallax image data also change. Therefore, the image data generating unit 231 can generate left parallax image data with a view point that is different from the view point of the temporary left parallax image data. Likewise, it is possible to generate right parallax image data with a view point that is different from the view point of the temporary right parallax image data. If (Formula 15) and (Formula 16) are rewritten as below, then the three-dimensional effect can be varied with the parameter C.

The left parallax modulation can be represented by (Formula 17).

$$Lt'(x, y) = N'(x, y) \frac{(1-C)Lt(x, y) + C \cdot Rt(x, y)}{\frac{Lt(x, y) + Rt(x, y)}{2}} \qquad \text{(Formula 17)}$$

The right parallax modulation can be represented by (Formula 18).

$$Rt'(x, y) = N'(x, y) \frac{(1-C)Rt(x, y) + C \cdot Lt(x, y)}{\frac{Lt(x, y) + Rt(x, y)}{2}} \qquad \text{(Formula 18)}$$

C takes a value in the range 5≤C≤0.5, when C=0, the result is the same as (Formula 15) and (Formula 16), and when C=0.5, the result is the same as not performing parallax modulation, and the three-dimensional effect is eliminated. When 0<C<0.5, an intermediate three-dimensional effect is produced.

Embodiment 4

Correction of Asymmetrical Blurring by Horizontal Direction Smoothing of the Lt/Rt Images Embodiment 4 is an embodiment in which asymmetrical blurring correction in the same way as for Embodiment 1 is carried out on the parallax Lt image and the parallax Rt image generated by adding parallax modulation, by exchanging the order in which after correcting the asymmetric blurring of the N image in Embodiment 3, the parallax Lt image and the parallax Rt image with the parallax modulation were generated.

Although not particularly discussed regarding Embodiment 1, if the asymmetric blurring is completely corrected, the left parallax image and the right parallax image will have the same blurring properties, and the disparity will be eliminated. Embodiment 4 positively uses this fact. Namely, by strongly controlling the asymmetric blurring correction, it is possible to obtain the same effect as the effect of controlling the amount of parallax modulation described at the end of Embodiment 3, while at the same time correcting the asymmetric blurring. This is a new means of controlling the amount of disparity in the single lens pupil divided stereoscopic image-capturing system.

The image processing procedure is generally as follows.
1) Input parallax multiplexed mosaic image data
2) Generate temporary parallax image
3) Generate standard images with no parallax by performing local brightness distribution correction between the left and right pixels
(local gain balance correction)
4) Generate actual parallax image
5) Correct asymmetric blurring by smoothing the actual parallax image The following is a description of the procedure.
Steps 1 to 3 are the same as for Embodiment 3, so their description is omitted.

4) Generate Actual Parallax Image

The N image is substituted into (Formula 15) and (Formula 16) not passing through (Formula 14) of step 4 of Embodiment 3, so (Formula 15) and (Formula 16) are modified into the following formulae. Note that the actual parallax image is generated using the left view point temporary parallax image and the right view point temporary parallax image, so it is an image based on the parallax image data.

The left parallax modulation can be represented by (Formula 19).

$$Lt'(x, y) = N(x, y) \frac{2Lt(x, y)}{Lt(x, y) + Rt(x, y)} \quad \text{(Formula 19)}$$

The right parallax modulation can be represented by (Formula 20).

$$Rt'(x, y) = N(x, y) \frac{2Rt(x, y)}{Lt(x, y) + Rt(x, y)} \quad \text{(Formula 20)}$$

5) Correct Asymmetric Blurring by Smoothing the Actual Parallax Image (Formula 4) to (Formula 9) in Embodiment 1 are executed as they are. At this time, the fixed standard value as described above is used as the value of the constant $\sigma_0$, which is a standard value of the radius of Gaussian blurring. As a result, the weighting parameter a indicated in (Formula 8) and (Formula 9) plays a role of means of controlling the disparity. When $\alpha=0$, the maximum disparity is produced, and when $\alpha=1$, the disparity is eliminated.

Note that in the flow of Embodiment 4, the reason the asymmetric blurring correction is not carried out on the output results of the temporary parallax images of step 2, and is carried out on the output results of the actual parallax images of step 4 is because the high-frequency component of the parallax Lt image and the parallax Rt image referred to for producing the non-parallax standard image (N image) has not being eliminated. Therefore, after obtaining high resolution output results for the N image, the parallax Lt image, and the parallax Rt image, the blurring state is corrected, so it is possible to obtain stereoscopic images with natural blurring without eliminating the high-resolution performance of any of the images.

Embodiment 5

In the above descriptions, the filter processing unit 233 carried out selective filtering on the image data in accordance with the disparity map, but the filter processing unit 233 may carry out filtering using filters that allow different frequency bands to pass in the horizontal direction and the vertical direction. For example, this filter has the property of maintaining the amount of blurring in the vertical direction for horizontal lines, and has the property of changing the frequency properties in the horizontal direction for vertical lines into a direction in which the amount of blurring is increased. By carrying out filtering using this type of filter by the filter processing unit 233, it is possible to reduce the difference in the amount of blurring in the horizontal direction and the amount of blurring in the vertical direction. Also, the filter processing unit 233 may carry out filtering in accordance with whether or not the spatial frequency is not less than a predetermined threshold. In other words, the filter processing unit 233 may carry out filtering so that the amount of change in the spatial frequency in the vertical direction and the horizontal direction are different from each other, on images that are the object of filtering such as images in parallax image data and the like.

Note that even if the pixels have a honeycomb structure that is not rectangular, the asymmetry of the aperture mask of the parallax pixels similarly produce an asymmetry of the pupil of the incident light flux through the lens, so the same process may be used to correct blurring asymmetry. In the first through fifth embodiments, a monochrome parallax multiplex single plate image-capturing system was described as an example, but if the image sensor also includes a color filter, the same may be carried out on each color component after carrying out color interpolation for each of the N image, the parallax Lt image, and the parallax Rt image. Alternatively, the process may be simplified by carrying it out on a brightness plane only.

The following modified examples can be considered as methods for obtaining parallax information by single lens system pupil division.

1) The incident light of a single lens is divided in two axial directions equally according to light intensity by a prism, and double plate type image-capturing is carried out using a left parallax image sensor and a right parallax image sensor each having only one type of parallax pixel. In this way, it is possible for each pixel to have the two types of information, the right parallax pixel value and the left parallax pixel value.

2) Apertures equivalent to the virtual pupils shown in FIGS. 4A to 4D can be inserted alternatively on the left side and right side as a single lens structure, and the normal non-parallax pixels of a monochrome image sensor are exposed twice in succession to acquire a left parallax image and a right parallax image.

An apparatus such as a personal computer or the like can be made to function as an image processing apparatus that performs the function of the image data generating unit 231, the disparity map generating unit 232, and the filter processing unit 233. The image processing apparatus may acquire parallax image data associated with image information (image capture information) from another device such as a camera or the like. In this case, the image data generating unit 231 plays the role as an image acquisition unit. Even when the image data generating unit 231 itself generates the parallax image data associated with the image information, the parallax image data can be said to have been acquired associated with the image data produced. The filter processing unit 233 carries out image processing in accordance with the image information. Specifically, if the image information indicates the fact that it has been generated from the output of pixels having a light receiving region with different lengths in the two axial directions, any of the filtering processes described in Embodiments 1 to 5 is carried out. The image processing apparatus is not limited to a personal computer, but various forms can be adopted. For example, an apparatus such as a TV, mobile phone, game machine, or the like having a display, or connected to a display can be the image processing apparatus. Note that images in the description above sometimes includes image data, and sometimes refers to the subject image itself that is developed and visualized in accordance with its format.

This completes the description of these embodiments of the present invention, but the technical scope of the present invention is not limited to the scope of these embodiments as described above. It will be clear to a person with ordinary skill in the art to which the present invention pertains that in these embodiments as described above, various types of modifications or improvements can be added. It is clear from the scope of the claims that these forms in which various modifications or improvements have been added are also included within the technical scope of the present invention.

The role of the aperture mask provided on the parallax pixels, even when a right parallax pixel and left parallax pixel coexist in a single microlens, may be considered to be that the light receiving part of the left parallax pixel plays the role of aperture mask for the right parallax pixel, and the light receiving part of the right parallax pixel plays the role of aperture mask for the left parallax pixel. In addition, a parallax C pixel can be defined in which an aperture having the same aperture shape as the parallax pixel of FIG. 6A is arranged in the center of the pixel. In this case also, asymmetric blurring is produced between vertical and horizontal, so correction can be carried out using the processes described in each embodiment.

Exif tags or the like that are used to identify the model of camera, for example, may be used as information that is applied to the image as image-capturing information to distinguish whether the sensor is for 3D or the sensor is for 2D.

Note that the sequence of execution of the process of each action, procedure, step, stage, and the like of the apparatus, systems, programs, and methods indicated in the scope of the patent claims, the specification, and the drawings can be executed in any order unless particularly indicated by "prior to", "preceding", or the like, or when the output of the previous process is used in a subsequent process. In the description of the operation flows in the scope of the patent claims and the specification, for convenience, terms such as "first", "next", and the like have been used, but this does not mean that execution in that sequence is essential.

The invention claimed is:

1. An image processing apparatus, comprising:
    a receiving unit receiving a first image and image-capturing information associated with the first image;
    a determining unit determining, based on the image-capturing information, whether or not the first image is an image of a subject image in a view point direction corresponding to an aperture mask, using an output signal of an image sensor that includes a pixel array including first parallax pixels having the aperture mask with asymmetric directional properties in a long axis and a short axis with respect to incident light flux of a single optical system and positioned to permit a portion of the light flux to pass; and
    an outputting unit outputting a corrected first image by carrying out a correction process having different frequency properties between the long axis direction and the short axis direction on the subject image in an unfocused region of the first image such that an asymmetric blurring between the long axis direction and the short axis direction of the aperture mask is reduced.

2. The image processing apparatus according to claim 1, wherein the correction process is a smoothing process in the short axis direction carried out on the subject image in the unfocused region of the first image.

3. The image processing apparatus according to claim 1, wherein the correction process carried out on the subject image in the unfocused region of the first image weakens an edge enhancement process of the subject image having a frequency component in the short axis direction more than an edge enhancement process of the subject image having a frequency component in the long axis direction.

4. The image processing apparatus according to claim 1, further comprising a receiving unit receiving, using the output signal of an image sensor that includes a pixel array including second parallax pixels having asymmetrical directional properties in the long axis and short axis with respect to incident light flux of a single optical system and an aperture mask that is positioned to permit a portion of the light flux that is different from that of the first image to pass in the short axis direction, a second image of a subject image in a view point direction corresponding to the aperture mask, wherein the subject image in the unfocused region of the first image is extracted based on an amount of disparity between the first image and the second image.

5. The image processing apparatus according to claim 1, wherein the outputting unit outputs the corrected first image carries out the correction process on only one direction from among the long axis direction and the short axis direction.

6. An image processing apparatus, comprising:
    a receiving unit receiving a first image and image-capturing information associated with the first image;
    a determining unit determining, based on the image-capturing information, using an image sensor that includes a pixel array including at least first parallax pixels having a first aperture mask and second parallax pixels having a second aperture mask with asymmetric directional properties in the long axis and short axis with respect to incident light flux of a single optical system and positioned to permit mutually different portions of the light flux to pass, and non-parallax pixels having a third aperture mask positioned to permit all the incident light flux to pass, whether or not the first image is an image of a subject image in a view point direction corresponding to the first aperture mask, a subject image in a view point direction corresponding to the second aperture mask, and a subject image in a view point direction corresponding to the third aperture mask, captured simultaneously in different pixels;
    a generating unit generating a standard image in a view point direction corresponding to the third aperture mask, using signals of the non-parallax pixels, the first parallax pixels, and the second parallax pixels of the captured image; and
    an outputting unit outputting a corrected standard image by carrying out a correction process having different frequency properties between the long axis direction and the short axis direction on the subject image in the unfocused region of the standard image.

7. The image processing apparatus according to claim 6, wherein the correction process carries out a smoothing process in the short axis direction on the subject image in the unfocused region of the standard image.

8. The image processing apparatus according to claim 6, wherein the correction process carried out on the subject image in the unfocused region of the standard image weakens an edge enhancement process of the subject image having a frequency component in the short axis direction more than an edge enhancement process of the subject image having a frequency component in the long axis direction.

9. The image processing apparatus according to claim 6, further comprising:
a generating unit generating a first image in a view point direction corresponding to the first aperture mask of each pixel, using the signal of the first parallax pixels; and
a generating unit generating a second image in a view point direction corresponding to the second aperture mask of each pixel, using the signal of the second parallax pixels,
wherein the subject image of the unfocused region of the standard image is extracted based on an amount of disparity between the first image and the second image.

10. The image processing apparatus according to claim 6, wherein the outputting unit outputs the corrected standard image carries out the correction process in only one direction from among the long axis direction and the short axis direction.

11. An image processing apparatus, comprising:
an image acquisition unit for acquiring input parallax image data and image-capturing information associated with the input parallax image data, the image-capturing information indicating that the input parallax image data was generated from an output of pixels having a light receiving region with different lengths in two axial directions; and
an image processor for carrying out filtering on an image based on the input parallax image data associated with the image-capturing information, such that the amount of change in a spatial frequency in a first axis direction and a second axis direction corresponding to the two axis directions are different from each other and an asymmetric blurring between the first axis direction and the second axis direction corresponding to the two axis directions is reduced.

12. The image processing apparatus according to claim 11, wherein on the image based on the input parallax image data, the image processor carries out a stronger smoothing process on a subject image having a frequency component in the shorter axis direction of the first axis direction and the second axis direction than the smoothing process on the subject image having a frequency component in the long axis direction.

13. The image processing apparatus according to claim 11, wherein on an image based on the input parallax image data, the image processor carries out a weaker edge enhancement process on a subject image having a frequency component in the shorter axis direction of the first axis direction and the second axis direction than an edge enhancement process on the subject image having a frequency component in the long axis direction.

14. The image processing apparatus according to claim 11, wherein the image processor carries out the filtering using a filter that permits different frequency bands to pass in the first axis direction and the second axis direction.

15. The image processing apparatus according to claim 11, wherein the image processor generates a disparity map indicating positional information regarding the depth of an object relative to the focused region, and carries out selective filtering in accordance with the disparity map.

16. The image processing apparatus according to claim 15, wherein the image acquisition unit acquires corresponding parallax image data corresponding to a view point that is different from the view point of the input parallax image data, and
the image processor calculates the ratio of the value of the sum of the pixel values corresponding to the input parallax image data and the corresponding parallax image data and the value of the product thereof, and generates the disparity map based on the ratio.

17. The image processing apparatus according to claim 16, wherein the image acquisition unit acquires non-parallax image data corresponding to the standard direction, and
the image processor generates standard image data corresponding to the standard direction using the input parallax image data, the corresponding parallax image data, and the non-parallax image data, and carries out the filtering on the standard image data.

18. The image processing apparatus according to claim 16, wherein the image acquisition unit acquires non-parallax image data corresponding to the standard direction, and
the image processor generates standard image data corresponding to the standard direction using the input parallax image data, the corresponding parallax image data, and the non-parallax image data, generates high-resolution input parallax image data using the input parallax image data and the standard image data, generates high-resolution corresponding parallax image data using the corresponding parallax image data and the standard image data, and carries out the filtering on the high-resolution parallax image data and the high-resolution corresponding parallax image data.

19. The image processing apparatus according to claim 18, wherein the image processor carries out the filtering in accordance with a predetermined amount of disparity.

20. The image processing apparatus according to claim 11, wherein the image processor carries out the filtering excluding the focused region.

21. An image-capturing apparatus, comprising:
an image sensor for outputting the parallax image data; and
an image processing apparatus described in claim 11.

22. The image processing apparatus according to claim 11, wherein the image processor carries out the filtering in only one direction from among the first axis direction and the second axis direction.

23. Non-transitory computer readable medium having an image processing program stored thereon, the image processing program causing a computer to perform procedures of:
an image acquisition step of acquiring parallax image data associated with image-capturing information indicating that the parallax image data was generated from an output of pixels having a light receiving region with different lengths in two axial directions; and
an image processing step of carrying out filtering on the image based on the parallax image data associated with the image-capturing information, such that the amounts of change in a spatial frequency in a first axis direction and a second axis direction corresponding to the two axis directions are different from each other and an asymmetric blurring between the first axis direction and the second axis direction corresponding to the two axis directions is reduced.

* * * * *